United States Patent
Hino et al.

(10) Patent No.: US 9,214,458 B2
(45) Date of Patent: Dec. 15, 2015

(54) SEMICONDUCTOR DEVICE

(71) Applicant: Mitsubishi Electric Corporation, Chiyoda-ku (JP)

(72) Inventors: Shiro Hino, Tokyo (JP); Naruhisa Miura, Tokyo (JP); Masayuki Imaizumi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/426,062

(22) PCT Filed: Apr. 11, 2013

(86) PCT No.: PCT/JP2013/002457
§ 371 (c)(1),
(2) Date: Mar. 4, 2015

(87) PCT Pub. No.: WO2014/038110
PCT Pub. Date: Mar. 13, 2014

(65) Prior Publication Data
US 2015/0236012 A1  Aug. 20, 2015

(30) Foreign Application Priority Data
Sep. 6, 2012 (JP) ................... 2012-196413

(51) Int. Cl.
*H01L 27/095* (2006.01)
*H01L 27/06* (2006.01)
(Continued)

(52) U.S. Cl.
CPC ........ *H01L 27/0629* (2013.01); *H01L 29/1608* (2013.01); *H01L 29/872* (2013.01)

(58) Field of Classification Search
CPC .............. H01L 27/0629; H01L 29/872; H01L 29/1608

USPC ............................. 257/471, 475, 478
See application file for complete search history.

(56) References Cited

U.S. PATENT DOCUMENTS 7,005,704 B2 * 2/2006 Hayashi ............... H01L 29/739
257/342
7,151,280 B2  12/2006 Hayashi et al.
(Continued)

FOREIGN PATENT DOCUMENTS

JP  2003 17701  1/2003
JP  2005 183563  7/2005
(Continued)

OTHER PUBLICATIONS

International Preliminary Report on Patentability and Written Opinion issued Mar. 19, 2015 in PCT/JP2013/002457 (with English language translation).
(Continued)

*Primary Examiner* — Hung Vu
(74) *Attorney, Agent, or Firm* — Oblon, McClelland, Maier & Neustadt, L.L.P.

(57) ABSTRACT

In a semiconductor device having a built-in Schottky barrier diode as a reflux diode, a maximum unipolar current is increased in a reflux state and a leakage current is reduced in an OFF state. A Schottky electrode is provided in at least a part of a surface between adjacent well regions of a second conductivity type disposed on a surface layer side of a drift layer of a first conductivity type, and an impurity concentration of a first conductivity type in a first region provided in a lower part of the Schottky electrode and provided between the adjacent well regions is set to be higher than a first impurity concentration of a first conductivity type in the drift layer and to be lower than a second impurity concentration of a second conductivity type in the well region.

30 Claims, 9 Drawing Sheets

(51) Int. Cl.
*H01L 29/872* (2006.01)
*H01L 29/16* (2006.01)

(56) References Cited

U.S. PATENT DOCUMENTS

| | | | |
|---|---|---|---|
| 8,003,991 B2 | 8/2011 | Yatsuo et al. | |
| 8,450,798 B2* | 5/2013 | Session | H01L 27/0629 257/280 |
| 2013/0277688 A1* | 10/2013 | Nakano | H01L 21/046 257/77 |
| 2014/0048847 A1 | 2/2014 | Yamashita et al. | |

FOREIGN PATENT DOCUMENTS

| | | |
|---|---|---|
| JP | 2007 234925 | 9/2007 |
| JP | 2013 48230 | 3/2013 |

OTHER PUBLICATIONS

International Search Report Issued Jul. 9, 2013 in PCT/JP2013/002457 Filed Apr. 11, 2013.

Office Action issued May 19, 2015 in Japanese Patent Application No. 2014-534155 (with English language translation).

* cited by examiner

F I G . 5
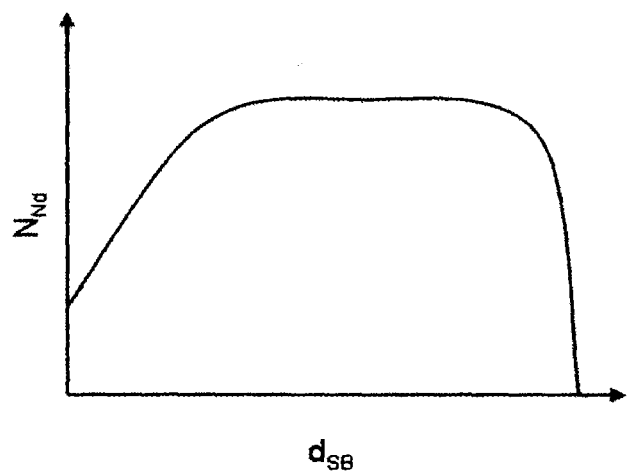
F I G . 6
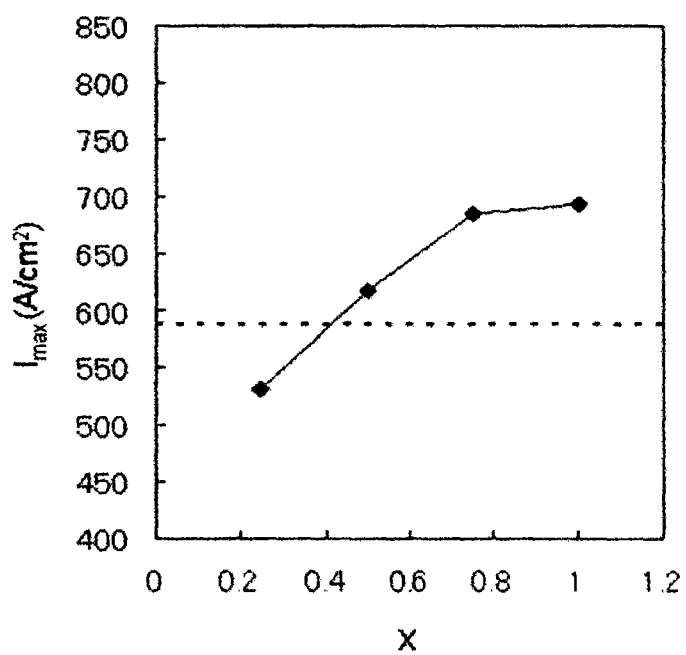

F I G . 1 3
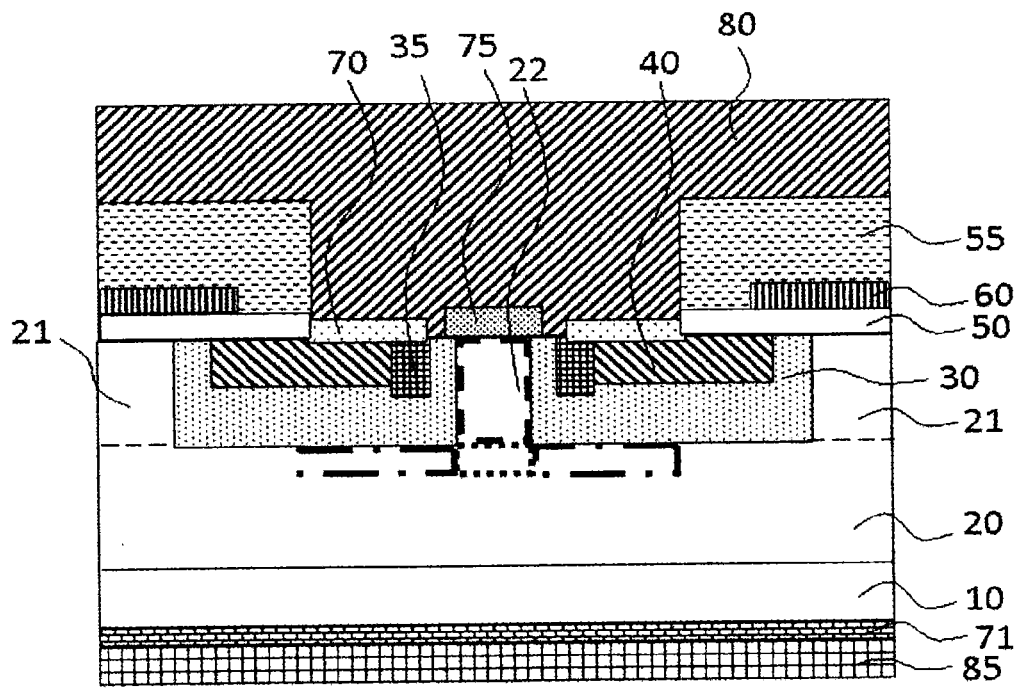
F I G . 1 4
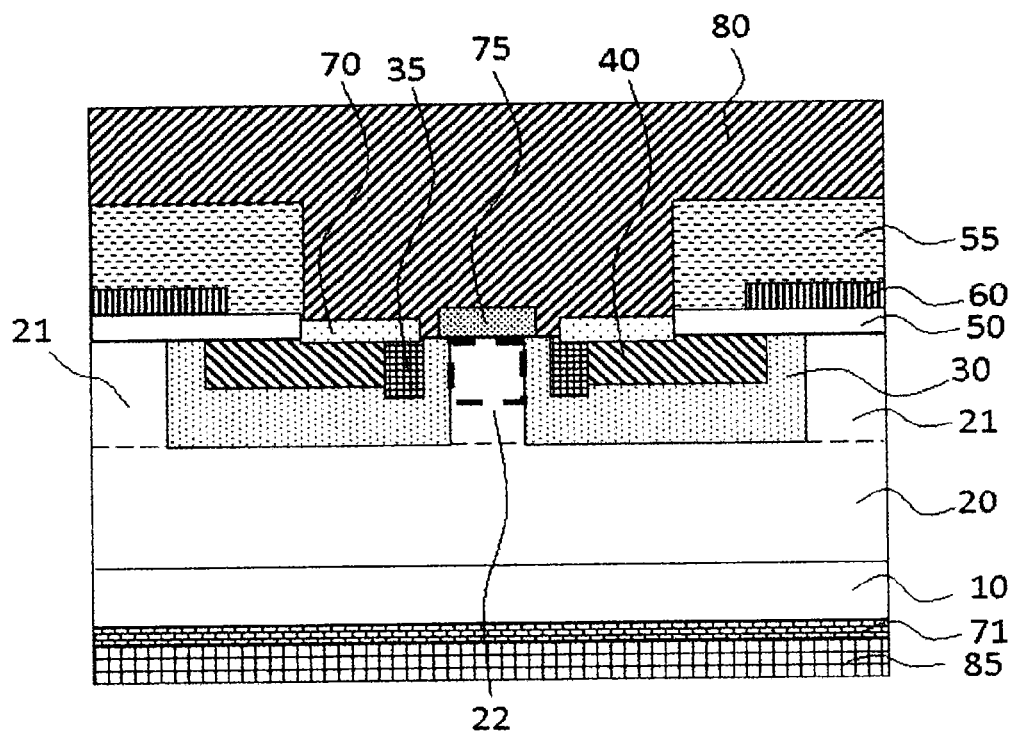

SEMICONDUCTOR DEVICE

TECHNICAL FIELD

The present invention relates to a semiconductor device.

BACKGROUND ART

In a semiconductor device such as an MOSFET (Metal-Oxide-Semiconductor Field-Effect-Transistor), it is possible to use a built-in diode as a reflux diode. There is proposed a method of building in and utilizing a Schottky barrier diode as a reflux diode (for example, see Patent Document 1).

For example, in the case in which a pn diode is built in a structure of a semiconductor device such as an MOSFET, there is caused a problem in that a recovery loss is increased when the pn diode is operated in the use of a built-in Schottky barrier diode. For this reason, it is desirable that a unipolar current caused to flow by the Schottky barrier diode should be large in a state in which the pn diode is not operated (a bipolar operation). At this time, it is desirable to increase the unipolar current without enlarging a chip area, that is, to increase a unipolar current density, in order to reduce a chip cost. In other words, it is desirable that a component of a reflux current should be constituted by only the unipolar current and the unipolar current density should have a great maximum value at that time. For this reason, there is proposed a method of causing an impurity concentration of a first conductivity type in a region provided directly under a Schottky electrode between adjacent well regions to be higher than that of the first conductivity type of a drift layer in the same region, thereby increasing a unipolar current density (for example, see Patent Document 2).

PRIOR ART DOCUMENTS

Patent Documents

Patent Document 1: Japanese Patent Application Laid-Open No. 2003-017701
Patent Document 2: Japanese Patent Application Laid-Open No. 2007-234925

SUMMARY OF INVENTION

Problems to be Solved by the Invention

In the conventional built-in Schottky barrier diode, however, a region of a second conductivity type having an impurity concentration that is equal to a concentration of a first conductivity type of a drift layer and is equal to an impurity concentration of a second conductivity type of a well region is inverted (returned) into the first conductivity type by implanting of an impurity of the first conductivity type, and the impurity concentration of the first conductivity type in the region is set to be higher than that of the first conductivity type of the drift layer, and a Schottky electrode is formed on the region. For this reason, the impurity concentration of the first conductivity type in the region provided directly under the Schottky electrode is higher than the impurity concentration of the second conductivity type of the well region. When an MOSFET is OFF, therefore, there is a problem in that a depletion layer is not sufficiently extended to a lower part of the Schottky electrode and an electric field intensity to be applied to a Schottky barrier junction is raised so that a leakage current of the Schottky barrier junction is increased, resulting in deterioration in reliability of a semiconductor device.

In order to solve the problems described above, it is an object of the present invention to provide a semiconductor device capable of enhancing reliability of an element while increasing a unipolar current density of a reflux diode.

Means for Solving the Problems

A semiconductor device according to the present invention includes a first region of a first conductivity type having an impurity concentration that is higher than a first impurity concentration of a drift layer of the first conductivity type and is lower than a second impurity concentration of a well region of a second conductivity type in a lower part of a Schottky electrode in a built-in Schottky barrier diode.

Moreover, the semiconductor device according to the present invention includes a first region of a first conductivity type in a lower part of a Schottky electrode in a built-in Schottky barrier diode, and has a feature that an impurity concentration in a certain depth of a first region is lower than a second impurity concentration of a well region of a second conductivity type in the same depth and is higher than a first impurity concentration of a drift layer of the first conductivity type.

Effects of the Invention

In the semiconductor device according to the present invention, the impurity concentration of the first region provided in the lower part of the Schottky electrode is set to be higher than the first impurity concentration of the drift layer between the adjacent well regions. For this reason, a pn diode is operated with difficulty so that a unipolar current density of a reflux diode can be increased. Furthermore, the impurity concentration of the first region is set to be lower than the second impurity concentration of the well region. Therefore, a depletion layer is sufficiently extended in the lower part of the Schottky electrode in an OFF state. Consequently, an electric field to be applied to a Schottky barrier junction is relieved so that a leakage current can be prevented from being increased.

Moreover, in the semiconductor device according to the present invention, the impurity concentration of the first region provided in the lower part of the Schottky electrode is set to be higher than the first impurity concentration of the drift layer between the adjacent well regions. For this reason, the pn diode is operated with difficulty so that the unipolar current density of the reflux diode can be increased. Furthermore, the impurity concentration of the first conductivity type in the certain depth of the first region is set to be lower than the second impurity concentration of the well region in the same depth. Also in the case in which the second impurity concentration of the well region has a distribution in a depth direction, consequently, the depletion layer is sufficiently extended in the lower part of the Schottky electrode in the OFF state. Consequently, the electric field to be applied to the Schottky barrier junction is relieved so that the leakage current can be prevented from being increased.

BRIEF DESCRIPTION OF DRAWINGS

FIG. 5 is a chart showing an impurity concentration profile in a first region of a semiconductor device according to a second embodiment of the present invention.

FIG. 6 is a chart showing a result obtained by simulating a relationship between a maximum unipolar current density and a value acquired through division of a thickness of the first region by a thickness of a well region, with a first impurity concentration of a drift layer set to be 3e15 cm$^{-3}$, according to the second embodiment of the present invention.

FIG. 13 is a sectional view showing another semiconductor device according to the third embodiment of the present invention.

FIG. 14 is a sectional view showing a semiconductor device according to a fourth embodiment of the present invention.

DESCRIPTION OF EMBODIMENTS

First Embodiment

Figure 1:
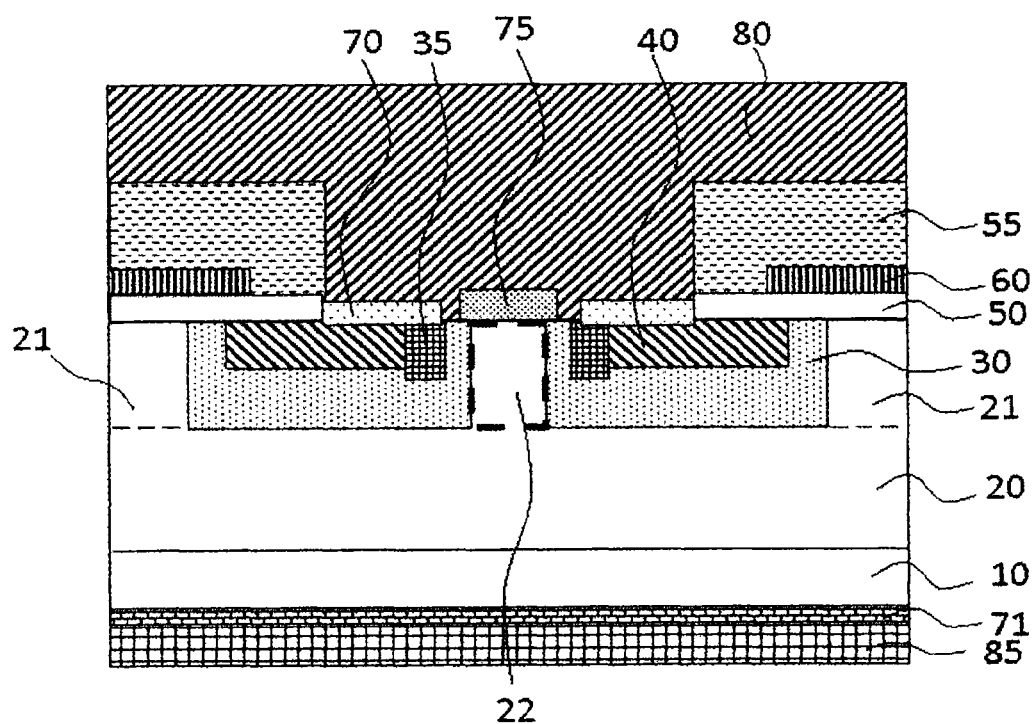
FIG. 1 is a sectional view showing a semiconductor device according to a first embodiment of the present invention.
Figure 2:
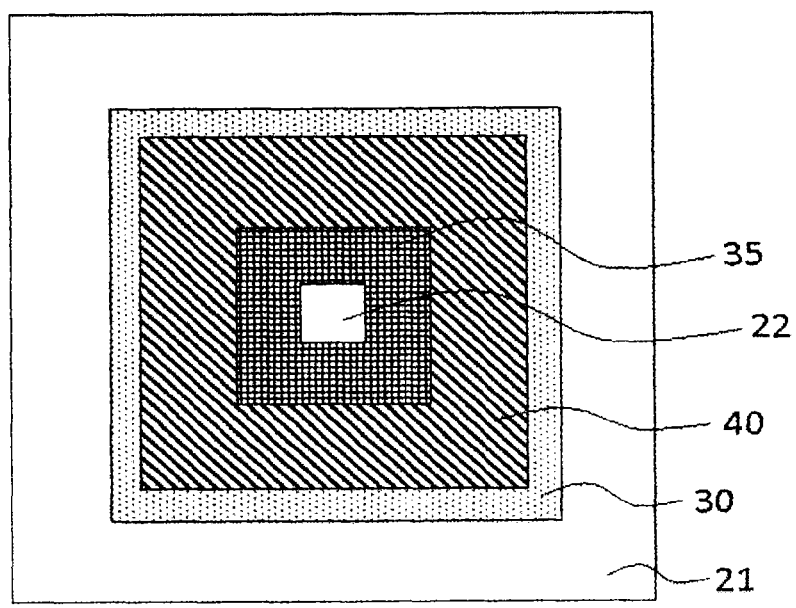
FIG. 2 is a top view showing a part of the semiconductor device according to the first embodiment of the present invention.

First of all, description will be given to a structure of a semiconductor device according to a first embodiment of the present invention. FIG. 1 is a sectional view showing the semiconductor device according to the first embodiment of the present invention and is a typical sectional view showing a unit cell of an MOSFET having a built-in SBD (Schottky Barrier Diode). FIG. 2 is a view showing a part of the semiconductor device according to the present invention as seen from above, and represents only a semiconductor region through transmission of an electrode, an insulating film and the like in FIG. 1. In the present embodiment, a silicon carbide (SiC) semiconductor device is taken as an example of the semiconductor device. Description will be given to an n-channel silicon carbide MOSFET in which a first conductivity type is set to be an n type and a second conductivity type is set to be a p type.

In FIGS. 1 and 2, a drift layer 20 constituted by n-type (first conductivity type) silicon carbide is formed on a first main surface of an n-type (first conductivity type) substrate 10 having a 4H polytype and made of silicon carbide having a low resistance. The substrate 10 made of the silicon carbide has a plane direction of the first main surface which is tilted by 4° in a c-axis direction on a (0001) plane. The drift layer 20 has a first impurity concentration of the n type (first conductivity type). A p-type (second conductivity type) well region 30 containing aluminum (Al) to be a p-type (second conductivity type) impurity is formed on a surface layer side of the drift layer 20. The well region 30 has a p-type (second conductivity type) second impurity concentration. The well region 30 is separated in two places as seen on a section in a unit cell, and are provided apart from each other in n-type (first conductivity type) regions which are referred to as a first separation region 22 and a second separation region 21, respectively. The first separation region 22 and the second separation region 21 are formed on the surface layer part of the drift layer 20 and are provided in the same depth from the surface of the drift layer 20 to a bottom part of the well region 30 in a depth direction in a region between the adjacent well regions 30.

An n-type (first conductivity type) source region 40 containing nitrogen (N) to be an n-type (first conductivity type) impurity is formed more shallowly than the depth of the well region 30 on a surface layer side at an inside of the well region 30. Moreover, a p-type (second conductivity type) well contact region 35 containing aluminum (Al) to be a p-type (second conductivity type) impurity is desirably formed in a region interposed between the source region 40 and the first separation region 22 at the surface layer side of the drift layer 20. A gate insulating film 50 constituted by silicon oxide is formed across a surface of the second separation region 21, a surface of the well region 30 and a surface of a part of the source region 40. Furthermore, a gate electrode 60 is formed on a surface of the gate insulating film 50 so as to be opposite to the second separation region 21, the well region 30 and an end of the source region 40. A region interposed between the second separation region 21 and the source region 40 in the well region 30, opposite to the gate electrode 60 with the gate insulating film 50 interposed therebetween and having an inversion layer formed in an ON operation is referred to as a channel region.

An interlayer insulating film 55 constituted by the silicon oxide is formed on the gate insulating film 50 to cover the gate electrode 60. A source ohmic electrode 70 for reducing a contact resistance with the silicon carbide is formed on a surface of the source region 40 which is not covered with the gate insulating film 50 and a surface of a part of the well contact region 35 at a side provided in contact with the source region 40. The well region 30 can easily send/receive an electron to/from the source ohmic electrode 70 through the well contact region 35 having a low resistance.

A Schottky electrode 75 is formed on a surface of the first separation region 22. The Schottky electrode 75 and the silicon carbide of the first separation region 22 are Schottky connected to each other. Although it is desirable that the Schottky electrode 75 should include the surface of the first separation region 22, it does not need to include the same surface. A source electrode 80 is formed on the source ohmic electrode 70, the Schottky electrode 75 and the interlayer insulating film 55. The source electrode 80 electrically short-circuits the source ohmic electrode 70 and the Schottky electrode 75. In other words, the source ohmic electrode 70 and the Schottky electrode 75 are electrically connected to each other. A drain electrode 85 is formed on a second main surface at an opposite side to the first main surface of the substrate 10, that is, a back side with a back ohmic electrode 71 interposed therebetween. Moreover, the gate electrode 60 electrically short-circuits a gate pad and a gate wiring through a gate contact hole formed on the interlayer insulating film 55 in a part of a region in the semiconductor device where a unit cell is not present, which is not shown.

In the present embodiment, as described above, the gate insulating film 50 is formed on the surface of the second separation region 21, and the Schottky electrode 75 is formed on the surface of the first separation region 22.

Moreover, the n-type (first conductivity type) impurity concentration in the first separation region 22 is set to be higher than the n-type (first conductivity type) first impurity concentration of the drift layer 20 and to be lower than the p-type (second conductivity type) second impurity concentration of the well region 30. In the present embodiment, this region is referred to as a first region (a region surrounded by a thick broken line in FIG. 1). In the first embodiment, the first separation region 22 and the first region are the same regions. In the present embodiment, the n-type impurity concentration of the second separation region 21 in the drift layer 20 is set to be equal to the first impurity concentration of the drift layer 20.

Moreover, the second separation region 21 is a path through which an ON-state current flows in an ON state of the MOSFET and the first separation region 22 is a path through which a unipolar current to be a reflux current of the Schottky barrier diode flows, which will be described later in detail.

Next, description will be given to a method of manufacturing an MOSFET having a built-in SBD to be the semiconductor device according to the present embodiment.

First of all, the drift layer 20 made of silicon carbide having a thickness of 5 to 50 µm is epitaxially grown with an n-type impurity concentration of $1 \times 10^{15}$ cm$^{-3}$ to $1 \times 10^{17}$ cm$^{-3}$ on the surface of the n-type substrate 10 having the plane direction of the first main surface which is the (0001) plane, having a 4H polytype and made of silicon carbide having a low resistance, by a CVD (Chemical Vapor Deposition) method. The n-type impurity concentration of the drift layer 20 is referred to as a first impurity concentration.

Next, an implantation mask is formed on the surface of the drift layer 20 by a photoresist or the like and an Al ion to be a p-type impurity is implanted. At this time, an Al ion implantation depth is set to be approximately 0.5 to 3 µm which does not exceed the thickness of the drift layer 20. Moreover, it is assumed that an impurity concentration of the implanted Al ion ranges from $1 \times 10^{17}$ cm$^{-3}$ to $1 \times 10^{19}$ cm$^{-3}$ and is higher than the first impurity concentration of the drift layer 20. Then, the implantation mask is removed. By the present step, a region where the Al ion is implanted serves as the well region 30 and the p-type impurity concentration is referred to as a second impurity concentration.

Subsequently, an implantation mask is formed on the surface of the drift layer 20 by a photoresist or the like and an N ion to be an n-type impurity is implanted. It is assumed that an N ion implantation depth is smaller than the thickness of the well region 30. Moreover, it is assumed that an impurity concentration of the implanted N ion ranges from $1 \times 10^{18}$ cm$^{-3}$ to $1 \times 10^{21}$ cm$^{-3}$ and exceeds a p-type second impurity concentration of the well region 30. In the present step, a region indicative of the n-type in the region where N is implanted serves as the source region 40.

Then, an implantation mask is formed on the surface of the drift layer 20 by a photoresist or the like and an Al ion to be a p-type impurity is implanted, and the implantation mask is thereafter removed. By the present step, a region where Al is implanted serves as the well contact region 35. The well contact region 35 is provided to obtain an excellent electrical contact of the well region 30 and the source ohmic electrode 70. It is desirable that a p-type impurity concentration of the well contact region 35 should be set to be higher than the p-type second impurity concentration of the well region 30. In the present step, when the p-type impurity ion is to be implanted, it is desirable that the substrate 10 or the drift layer 20 should be heated to 150° C. or more to carry out ion implantation in order to reduce the resistance of the well contact region 35.

Subsequently, an implantation mask is formed on the surface of the drift layer 20 by a photoresist or the like and an N ion to be an n-type impurity is implanted. Consequently, the impurity concentration of the first separation region 22 is made higher than the first impurity concentration of the drift layer 20. An implantation region defined by the implantation mask and implanting conditions at this time corresponds to a first region and includes at least a part of a plane region of the first separation region 22, and preferably contains a plane region of the first separation region 22. In other words, it is preferable that an implantation region in the first separation region 22 seen on a section of FIG. 1 should be adjacent (adjacent to and in contact with) to both of the well regions 30 separated from each other in two places. In another example of the present embodiment, however, it is sufficient that they are adjacent to each other, and they do not need to be provided in contact with each other. In this case, a clearance is formed between the first region and the well region 30. For this reason, an amount of reduction in the resistance of the first separation region 22 is correspondingly decreased with respect to a current flowing from the source electrode 80 toward the drain electrode 85. As compared with the case in which the implantation region is not provided, however, it is apparent that an advantage of the reduction in the resistance of the first separation region 22 can be obtained.

In the example shown in FIG. 1 according to the present embodiment, description is given to the case in which the first region and the first separation region 22 are the same regions, that is, the case in which they are adjacent to each other. It is preferable that the impurity concentration of the N ion to be implanted should range from $5\times10^{15}$ cm$^{-3}$ to $1\times10^{18}$ cm$^{-3}$. In particular, it is assumed that the impurity concentration does not exceed the p-type second impurity concentration of the well region 30. The reason is as follows. The concentration of the first separation region 22 is reduced relatively with the well region 30 to extend a depletion layer to the first separation region 22 side when a reverse bias is applied to the pn junction formed between the well region 30 and the first separation region 22. The advantage of the depletion layer will be described later in detail.

In the example shown in FIG. 1 according to the present embodiment, the implantation depth of the n-type impurity in the first region is set to be equal to the depth of the well region 30 and the whole first separation region 22 is subjected to the implantation. Consequently, the first region is set to be the same as the first separation region 22.

In other words, the region surrounded by the thick broken line in FIG. 1 is set to be the first region. In the example shown in FIG. 1 according to the present embodiment, the first region is set to be the whole first separation region 22 as shown in FIG. 1.

Next, annealing is carried out for 30 seconds to one hour at 1300 to 1900° C. in an inert gas atmosphere such as an argon (Ar) gas by a heat treating device. By the annealing, the implanted N and Al ions are activated electrically.

Subsequently, the surface of the drift layer 20 having the well region 30, the source region 40 and the well contact region 35 formed thereon is thermally oxidized to form silicon oxide to be the gate insulating film 50 having a desirable thickness. Next, a polycrystalline silicon film having an electrical conductivity is formed on the gate insulating film 50 by a low pressure CVD method and is subjected to patterning to form the gate electrode 60. Then, the interlayer insulating film 55 is formed by the low pressure CVD method. Thereafter, a contact hole reaching the well contact region 35 and the source region 40 is formed through the interlayer insulating film 55 and the gate insulating film 50.

Next, a metal film containing Ni as a main component is formed by sputtering or the like and heat treatment is then carried out at a temperature of 600 to 1100° C. to cause the metal film containing Ni as the main component to react with a silicon carbide layer in the contact hole so that silicide is formed between the silicon carbide layer and the metal film. Subsequently, the metal film remaining on the interlayer insulating film 55 other than the silicide formed by the reaction is removed by wet etching using any of sulfuric acid, nitric acid and hydrochloric acid, a mixed solution of them and a hydrogen peroxide solution or the like. Consequently, the source ohmic electrode 70 is formed.

Subsequently, a metal containing Ni as a main component is formed on the back face of the substrate 10 (the second main surface) and is then heat treated to form the back ohmic electrode 71 on the back side of the substrate 10.

Next, patterning through the photoresist or the like is used to remove the interlayer insulating film 55 and the gate insulating film 50 which are provided on the first separation region 22 and the interlayer insulating film 55 in a position of the gate contact hole. Wet etching which does not damage the surface of the first separation region 22 is preferable for the removing method.

Subsequently, the Schottky electrode 75 is deposited by a sputtering method or the like. For the Schottky electrode 75, it is preferable to deposit Ti, Mo, Ni or the like.

Then, a wiring metal such as Al is formed on the surface of the treated substrate 10 by the sputtering method or an evaporation method, and is processed into a predetermined shape by a photolithographic technique, thereby forming the source electrode 80 in contact with the source ohmic electrode 70 and the Schottky electrode 75, and a gate pad and a gate wiring in contact with the gate electrode 60. Furthermore, the drain electrode 85 to be a metal film is formed on the surface of the back ohmic electrode 71 provided on the back face of the substrate 10. Consequently, there is finished the semiconductor device shown in the sectional view of FIG. 1 and the partial top view of FIG. 2.

Next, an operation of the MOSFET having the built-in SBD to be the semiconductor device according to the present embodiment will be briefly described in three states separately.

A first state represents the case in which a high voltage is applied to the drain electrode 85 with respect to the source electrode 80 and a positive voltage which is equal to or higher than a threshold is applied to the gate electrode 60, which will be hereinafter referred to as an "ON state". In the ON state, an inversion channel is formed in a channel region and a path through which an electron to be a carrier flows is formed between the n-type source region 40 and the n-type second separation region 21. On the other hand, an electric field in a direction in which the current flows with difficulty for Schottky connection, that is, a reverse direction (a reverse bias) is applied to the Schottky barrier junction formed in a contact part of the first separation region 22 and the Schottky electrode 75. For this reason, the current does not flow. The electron flowing from the source electrode 80 into the drain electrode 85 reaches the drain electrode 85 from the source electrode 80 via the source ohmic electrode 70, the source region 40, the channel region, the second separation region 21, the drift layer 20 and the substrate 10 in accordance with an electric field formed by the positive voltage applied to the drain electrode 85. Accordingly, the positive voltage is applied to the gate electrode 60 so that an ON-state current flows from the drain electrode 85 to the source electrode 80. At this time, a voltage to be applied between the source electrode 80 and the drain electrode 85 is referred to as an ON-state voltage, and a value obtained through division of the ON-state voltage by the ON-state current density is referred to as an ON resistance which is equal to a total of resistances of the path through which the electron flows. A product of the ON resistance and square of the ON-state current is equal to an electrification loss consumed in electrification by the MOSFET. For this reason, a lower ON resistance is preferred.

A second state represents the case in which a high voltage is applied to the drain electrode 85 with respect to the source electrode 80 and a voltage which is equal to or lower than the threshold is applied to the gate electrode 60, which will be hereinafter referred to as an "OFF state". In this state, an inversion carrier is not present in the channel region. For this reason, the ON-state current does not flow so that a high voltage applied to a load in the ON state is applied between the source electrode 80 and the drain electrode 85 in the MOSFET. An electric field in the same direction as the "ON state" is applied to the Schottky barrier junction formed in the contact part of the first separation region 22 and the Schottky electrode 75. For this reason, the current ideally does not flow. However, a much higher electric field than that in the "ON state" is applied. Therefore, a leakage current may be generated. In some cases in which the leakage current is large, heat generation of the MOSFET is increased so that the MOSFET and a module using the MOSFET are thermally destroyed. Therefore, in order to reduce the leakage current, it is preferable to decrease the electric field to be applied to the Schottky barrier junction.

A third state represents a state in which a low voltage is applied to the drain electrode 85 with respect to the source electrode 80, that is, a counter electromotive voltage is applied to the MOSFET, in which a reflux current flows from the source electrode 80 toward the drain electrode 85. This state will be hereinafter referred to as a "reflux state". In the reflux state, an electric field (a forward bias) in a forward direction is applied to the Schottky barrier junction formed in the contact part of the first separation region 22 and the Schottky electrode 75 so that a unipolar current constituted by an electron current flows from the Schottky electrode 75 toward the n-type first separation region 22. At this time, only the unipolar component is contained as the reflux current component of the reflux diode. If a density of the electronic current flowing through the Schottky electrode 75 is increased, voltage drop in the first separation region 22 is increased so that an electric potential of the drift layer 20 with respect to the source electrode 80 is reduced. The source electrode 80 and the well region 30 have the same electric potential through the source ohmic electrode 70. As a result, a forward bias is applied to the pn junction between the p-type well region 30 and the drift layer 20. When the forward bias is increased and thus exceeds a diffusion potential of the pn junction, a hole is injected from the well region 30 toward the drift layer 20. In other words, a pn diode through the p-type well region 30 and the n-type drift layer 20 is operated so that minor carriers are injected (a bipolar operation). More specifically, a bipolar current is added to the unipolar current in a current component of the reflux diode.

When the minor carriers are injected, the following two problems are caused. For a first problem, when change from the reflux state to the OFF state or the ON state is carried out, a recovery current is generated for the necessity to extract the hole injected as the minor carrier. For this reason, a power loss, that is, a recovery loss occurs. In other words, when the bipolar current is added to the current component of the reflux diode, the power loss is increased.

For a second problem, a semiconductor crystal is sometimes damaged by a recombination energy generated by recombination of a part of the holes injected as the minor carriers and electrons. For example, in the case of silicon carbide, it is known that a stacking fault is caused by the recombination energy. There is a problem in that the stacking fault t causes a current to flow with difficulty, and a resistance of a device is thus increased, resulting in aging deterioration of a device characteristic.

In order to avoid these two problems and to obtain a reflux current which is as large as possible with the same chip area, it is desirable to implement an MOSFET having a built-in SBD which has a high density of a maximum current (a maximum unipolar current density) caused to flow by only a unipolar current without causing a bipolar operation, that is, a high maximum unipolar current density with a reflux diode component constituted by only the unipolar current.

As is apparent from the description, in order to increase the maximum unipolar current density, it is effective to cause the impurity concentration of the first region to be higher than the first impurity concentration of the drift layer 20, thereby reducing the resistance of the first separation region 22, that is, to suppress voltage drop of the first separation region 22, thereby reducing the forward bias to be applied to the pn junction between the well region 30 and the drift layer 20 to prevent the bipolar operation from occurring.

In the present embodiment, the n-type impurity concentration of the first region in the first separation region 22 is caused to be higher than the first impurity concentration of the drift layer 20 so that the resistance of the first separation region 22 is reduced. Therefore, it is possible to reduce the forward bias to be applied to the pn junction. In other words, the current density of the reflux diode in the state in which the minor carrier is not injected, that is, the maximum value of the unipolar current density is increased. Therefore, it is possible to increase the maximum unipolar current density of the reflux diode.

Moreover, in the present embodiment, it is possible to increase the unipolar current density of the reflux diode in the state in which the minor carrier is not injected into the silicon carbide to be the drift layer 20, that is, the maximum unipolar current. Therefore, there is an advantage that it is possible to suppress the aging deterioration of the device characteristic without causing the stacking fault while increasing the reflux current.

However, if the n-type impurity concentration of the first region is made higher than the second impurity concentration of the well region 30, the depletion layer is not sufficiently extended from the well region 30 to the first separation region 22 in the OFF state so that the electric field to be applied to the Schottky barrier junction is increased, resulting in increase in the leakage current. For this reason, it is important to cause the n-type (first conductivity type) impurity concentration of the first region to be lower than the p-type (second conductivity type) second impurity concentration of the well region 30.

In the case in which the second impurity concentration of the well region 30 has a concentration distribution in the depth direction, it is sufficient to suppose extension in an orthogonal direction to a pn junction surface for simplifying extension of the depletion layer from the well region 30. In other words, even if the second impurity concentration of the well region 30 is varied depending on the depth, it is sufficient that the impurity concentration in the first region is lower than the second impurity concentration in the same depth of the well region 30.

More specifically, it is sufficient that the impurity concentration in a certain depth of the first region is lower than the second impurity concentration in the same depth of the well region 30 and is higher than the first impurity concentration of the drift layer 20.

In the case in which the present embodiment is not used, that is, the case in which the n-type impurity concentration of the whole first separation region 22 is equal to the first impurity concentration of the drift layer 20, it is possible to propose a method of increasing the width of the first separation region 22 as a method of increasing the maximum unipolar current density. In this case, the following two problems are caused.

As a first problem, a cell pitch corresponding to a length in a lateral direction of the substrate 10 in FIG. 1, that is, a length of a minimum cycle (a unit cell) configuring the MOSFET is increased with the increase in the width of the first separation region 22. Consequently, the ON resistance of the MOSFET is increased. The reason why the ON resistance is raised with the increase in the cell pitch is that the density of the path through which the ON current flows is decreased. For example, when the cell pitch is increased, a channel width density, that is, a width of a channel formed per unit area of the MOSFET is decreased so that a channel resistance which is almost inversely proportional to the channel width density is increased. Referring to the MOSFET using silicon carbide in a semiconductor material, particularly, the channel resistance occupies a large rate of the ON resistance because of a low channel mobility, which is a serious problem.

As a second problem, the electric field to be applied to the Schottky barrier junction in the OFF state is increased so that the leakage current is increased. The reason is as follows. First of all, in the OFF state, the depletion layer extended from the well region 30 toward the first separation region 22 serves to reduce an electric field intensity to be applied to the Schottky barrier junction. When the width of the first separation region 22 is increased, a high voltage which cannot completely be shielded by the depletion layer leaks to the upper part of the first separation region 22. As a result, the electric field intensity to be applied to the Schottky barrier junction is increased.

Referring to the first problem, according to the present embodiment, there is used a design technique in which the impurity concentration of the first region to be the first separation region 22 is higher than the first impurity concentration of the drift layer 20. For this reason, the resistance of the first separation region 22 is reduced so that the maximum unipolar current density is increased and the maximum unipolar current can be raised. In other words, in the first embodiment, the increase in the cell pitch is not required and the maximum unipolar current can be increased without the increase in the ON resistance.

On the other hand, when the concentration of the first separation region 22 is raised, the electric field from the inner part of the first separation region 22 toward the Schottky electrode 75 is increased in the OFF state. Therefore, the electric field intensity to be applied to the Schottky barrier junction is increased. However, there was found the fact that the amount of the increase in the electric field intensity can be reduced relatively as compared with the case in which the width of the first separation region 22 is increased without using the present invention so that the same maximum unipolar current density is obtained.

More specifically, referring to the second problem, it was found that the electric field to be applied to the Schottky barrier junction can be reduced more greatly in the case in which the first embodiment is used as compared with the case in which the width of the first separation region 22 is increased.

This mechanism can be described semi-quantitatively as follows.

First of all, the reflux state will be considered. A resistance in a position where a depth, that is, a distance in a depth direction from the Schottky barrier junction is represented by z in the first separation region 22 is determined by a resistivity of the first separation region 22 and a width of an effective conduction path. The effective conduction path represents a region obtained by removing, from the first separation region 22, the depletion layer extended from the well region 30. A resistance of the first separation region 22 is represented by $R_{IS}$. $R_{IS}$ is a value obtained through multiplication of a resistance per unit area of the first separation region 22 by a width $L_w$ of the first separation region 22. A differential resistance $dR_{IS}/dz$ with the depth z in the resistance $R_{IS}$ of the first separation region 22 is expressed in (Equation 1).

[Equation 1]

$$\frac{dR_{IS}}{dz} = \frac{1}{q\mu N_{IS}} \cdot \frac{1}{(L_w - 2L_d)} \quad \text{(Equation 1)}$$

Herein, q represents an elementary charge, μ represents a mobility of an electron to be a majority carrier in the first separation region 22, $N_{IS}$ represents a carrier concentration of the first separation region 22, and $L_w$ represents a width of the first separation region 22. $L_d$ implies a width of a depletion layer extended from a pn junction surface of the well region 30 and the first separation region 22 toward the first separation region 22. $L_d$ can be obtained in accordance with the following (Equation 2).

[Equation 2]

$$L_d = \sqrt{\frac{2\varepsilon_0\varepsilon_S}{qN_{IS}}(\Phi_{bi} + V_j(z))} \quad \text{(Equation 2)}$$

Herein, $\varepsilon_0$ represents a permittivity of vacuum, $\varepsilon_s$ represents a relative permittivity of the semiconductor configuring the first separation region 22, $\Phi_{bi}$ represents a diffusion potential of the pn junction, and $V_j(z)$ represents an electric potential based on the source electrode 80 in the position with the depth z in the first separation region 22. (Equation 3) is obtained by (Equation 1) and (Equation 2).

[Equation 3]

$$\frac{dR_{IS}}{dz} = \frac{1}{q\mu N_{IS}L_w - \sqrt{8\varepsilon_0\varepsilon_S\mu^2 qN_{IS}(\Phi_{bi} + V_j(z))}} \quad \text{(Equation 3)}$$

Next, the OFF state will be considered. In the OFF state, the whole first separation region 22 is depleted by the depletion layer extended from the well region 30 toward the first separation region 22. The electric field intensity to be applied to the Schottky barrier junction in the OFF state is proportional to a potential difference between the Schottky electrode 75 with the same electric potential as the source electrode 80 and the depleted first separation region 22. In order to accurately estimate the electric potential of the first separation region 22 at this time, it is necessary to discuss using a two-dimensional simulation which will be described below. However, the electric potential of the first separation region 22 in the OFF state can approximate to be substantially equal to an electric potential with which the first separation region 22 is completely depleted for the first time when the electric potential of the first separation region 22 is raised with a rise in the drain voltage. In other words, when the first separation region 22 is completely depleted, the electric potential of the first separation region 22 maintains a value in the depletion to be almost constant even if the drain voltage is raised. For this reason, it is apparent that the electric field intensity to be applied to the Schottky barrier junction can be reduced more greatly in the OFF state with the structure of the first separation region 22 which is completely depleted by a lower drain voltage. It can be supposed that $V_{jd}(z)$ is $L_w=2L_d$, that is, is equal to $V_j(z)$ in which a denominator on a right side of (Equation 3) is zero, wherein an electric potential with which the first separation region 22 is completely depleted in the depth z is represented by $V_{jd}(z)$. Therefore, $V_{jd}(z)$ can be obtained in accordance with (Equation 4).

[Equation 4]

$$V_{jd}(z) = \frac{qN_{IS}L_w^2}{8\varepsilon_0\varepsilon_S}\Phi_{bi} \quad \text{(Equation 4)}$$

Figure 3:
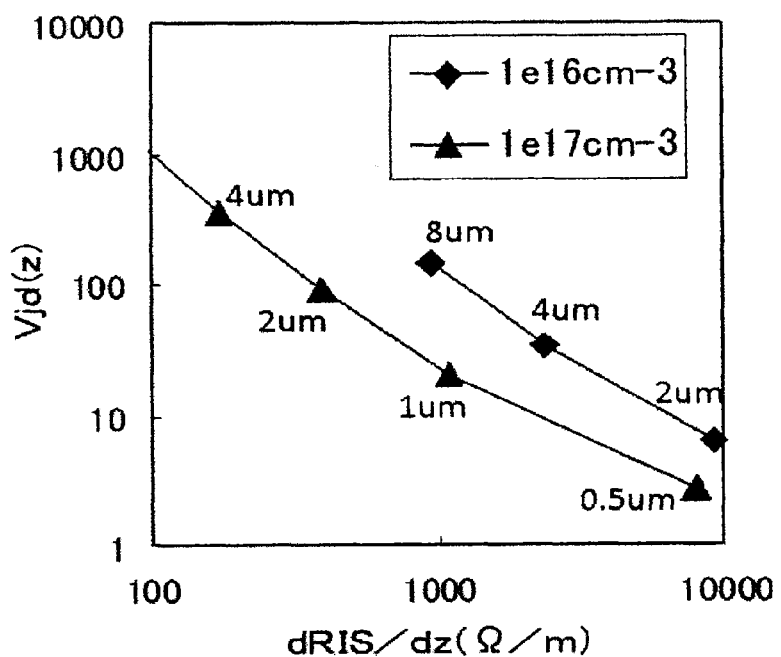
FIG. 3 is a chart showing a calculation result of a differential resistance in a reflux operation and a voltage at which a lower part of a Schottky electrode is completely depleted in an OFF state of the semiconductor device according to the first embodiment of the present invention.

FIG. 3 shows a relationship between the differential resistance $dR_{IS}/dz$ of the first separation region 22 which is obtained in accordance with (Equation 3) when $N_{IS}$ is set to be 1e16 or 1e17 $cm^{-3}$ and the electric potential $V_{jd}(z)$ of the first separation region 22 in the completed depletion of the first separation region 22 which is obtained in accordance with (Equation 4). $L_w$ is set to range from 0.5 to 8 μm and indicates a value of $L_w$ in each characteristic in the drawing. In FIG. 3, $V_j(z)$ in (Equation 3) for calculating $dR_{IS}/dz$ in the reflux state uses a Schottky barrier potential as an approximate value.

Referring to FIG. 3, Table 1 shows values of $V_{jd}(z)$ and $dR_{IS}/dz$ when $L_W$ is 2 μm, $N_{IS}$ is 1e16 or 1e17 cm$^{-3}$, $L_w$ is 8 μm, and $N_{IS}$ is 1e16 cm$^{-3}$.

TABLE 1

| $L_W$ (um) | $N_{IS}$ (cm$^{-3}$) | $V_{jd}(z)$ (V) | $dR_{IS}/dz$ (Ω/m) |
|---|---|---|---|
| 2 | 1e16 | 6.3 | 9202 |
| 2 | 1e17 | 90.1 | 395 |
| 8 | 1e16 | 164.2 | 937 |

From the condition that $L_w$ is 2 μm and $N_{IS}$ set to be 1e16 cm$^{-3}$ on the Table 1, it is apparent that $V_{jd}(z)$ can be decreased and $dR_{IS}/dz$ can be decreased more greatly with $L_w$ held to be 2 μm and $N_{IS}$ increased to be 1e17 cm$^{-3}$ than those with $N_{IS}$ maintained to be equal and $L_w$ set to be 8 μm.

More specifically, in the present embodiment, it is possible to decrease the potential difference $V_{jd}(z)$ of the first separation region 22 and the differential resistance $dR_{IS}/dz$ more greatly as compared with the increase in the width of the first separation region 22 without using the present embodiment. Therefore, it is possible to prevent the increase in the electric field intensity to be applied to the Schottky barrier junction and to increase the maximum unipolar current density.

Moreover, with reference to FIG. 3, $N_{IS}$ of 1e17 cm$^{-3}$ is compared with $N_{IS}$ of 1e16 cm$^{-3}$. $dR_{IS}/dz$ with the same $V_{jd}(z)$ is smaller when $N_{IS}$ is 1e17 cm$^{-3}$. Consequently, it is apparent that the value of $dR_{IS}/dz$ to obtain the same $V_{jd}(z)$ can be decreased if the impurity concentration of the first separation region 22 is increased. In other words, in the case in which the electric field intensity to be applied to the Schottky barrier junction is set to be equal in the OFF state, the resistance of the first separation region 22 in the reflux state can be reduced as the impurity concentration of the first separation region 22 is increased. More specifically, as the impurity concentration of the first separation region 22 is increased, the leakage current in the OFF state can be reduced, and at the same time, the maximum unipolar current density can be increased. Moreover, it is apparent that the electric field intensity of the Schottky barrier junction can be reduced when the impurity concentration of the first separation region 22 is increased if the maximum unipolar current density is set to be constant. Consequently, the leakage current in the OFF state can be reduced.

As a method of increasing the impurity concentration of the first separation region 22, it is possible to propose two methods, that is, a method of increasing only the impurity concentration of the first separation region 22 and a method of increasing the impurity concentration of the first separation region 22 and the first impurity concentration of the drift layer 20 with both of them set equal to each other. However, in the latter case, there is a problem in that a breakdown voltage of the MOSFET is reduced. A method of increasing the impurity concentration of the first separation region 22 without reducing the breakdown voltage can be implemented by only a method of causing the impurity concentration of the first region serving as the first separation region 22 to be higher than the first impurity concentration of the drift layer 20. In other words, it is possible to increase the maximum unipolar current density at the same breakdown voltage by causing the impurity concentration of the first region to be higher than the first impurity concentration of the drift layer 20.

In order to confirm validity of the semi-quantitative theory, the effect of the present embodiment was verified by a device simulation. There were assumed a structure A which does not use the first embodiment according to the present invention and a structure B using the first embodiment according to the present invention. With the structure A, the impurity concentration of the first separation region 22 was set to be 3e15 cm$^{-3}$ so as to be equal to the first impurity concentration of the drift layer 20, and the width of the first separation region 22 was set to be 3 μm. On the other hand, with the structure B, the impurity concentration of the first separation region 22 is set to be 5.3e16 cm$^{-3}$ which is higher than the first impurity concentration of the drift layer 20, that is, 3e15 cm$^{-3}$. The width of the first separation region 22 in the structure B is set to be 1.75 μm. The impurity concentration and the width in the first separation region 22 of the structure B are set in such a manner that the electric field intensity to be applied to the Schottky barrier junction is 1.2 MV/cm which is equal to that of the structure A when a voltage of 3300 V is applied in the OFF state. Dimensions other than in the first separation region 22 are equal to each other in the structure A and the structure B. In other words, a cell pitch is smaller in the structure B using the first embodiment.

Figure 4:
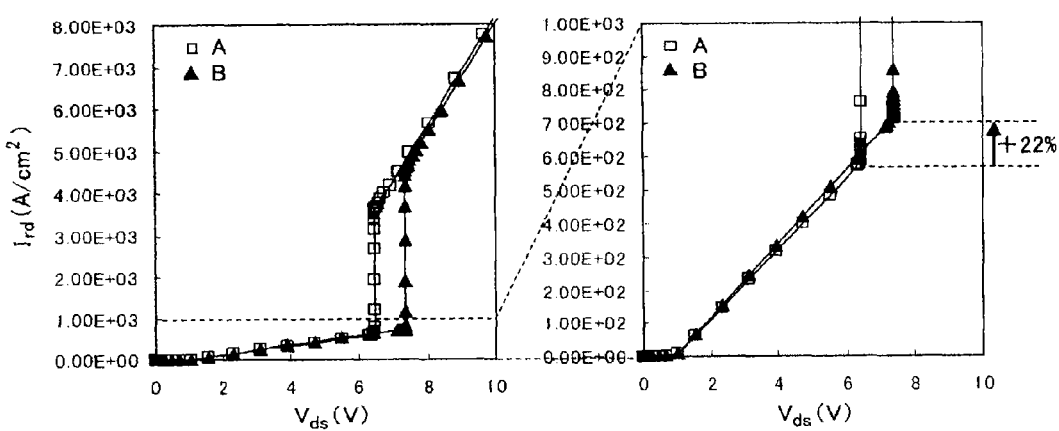
FIG. 4 is a chart showing a result of a relationship between a source—drain voltage in a reflux state and a density of a reflux current flowing per unit area, the relationship being obtained by a device simulation according to the first embodiment of the present invention.

FIG. 4 shows a relationship between the voltage $V_{ds}$ between the source and the drain in the reflux state and the reflux current density $I_{rd}$ flowing per unit area, which is obtained by the device simulation. A sudden rise in the current density in the middle implies that the pn diode configured from the well region 30 and the drift layer 20 is operated and the minor carrier is injected into the drift layer 20, resulting in a conductivity modulation. In other words, it implies that the bipolar current is added, as a reflux current component, to the unipolar current. It is apparent that a current density obtained immediately before occurrence of this phenomenon corresponds to the maximum unipolar current density and is enhanced by 22% in the structure B than in the structure A. Moreover, the cell pitch is smaller in the structure B. For this reason, it is obvious that the ON resistance is reduced. More specifically, in the case in which the electric field intensity to be applied to the Schottky barrier junction is constant, the maximum unipolar current density is increased more greatly in the structure B using the first embodiment so that the ON resistance can be reduced. In the present description, the electric field intensities to be applied to the Schottky barrier junction are set to be equal to each other in the structure A and the structure B. However, in the case in which the maximum unipolar current densities are designed to be equal, it is apparent to obtain the result that the electric field intensity to be applied to the Schottky barrier junction is reduced more greatly in the structure B.

As described above, by using the first embodiment, it is possible to suppress the electric field to be applied to the Schottky barrier junction in the OFF state of the MOSFET and to reduce the leakage current. Consequently, it is possible to obtain an advantage that thermal runaway is caused with difficulty and a semiconductor device having high reliability can be thus obtained.

Moreover, it is possible to increase the unipolar current density without increasing the width of the first separation region 22. Therefore, it is possible to prevent the increase in the ON resistance without requiring to increase the cell pitch of the MOSFET. Consequently, it is possible to obtain an advantage that a chip area can be reduced and a cost can be thus cut down.

Furthermore, it is possible to decrease the voltage drop of the first separation region 22 to be the region interposed between the well regions 30 in the lower part of the Schottky barrier junction. Therefore, it is possible to obtain an advantage that the unipolar current density can be increased in a state in which the minor carrier is not injected into the pn junction of the well region 30 and the drift layer 20. In other words, in a semiconductor device having the same chip area, it is possible to obtain an advantage that the maximum unipolar current can be increased before the addition of the bipolar current to the reflux current component.

Moreover, the minor carrier is not injected into the pn junction in the reflux state. Therefore, it is possible to obtain an advantage that a semiconductor crystal is not damaged and the aging deterioration of the device characteristic is not caused.

Although the nitrogen is used as the n-type (first conductivity type) impurity in the present embodiment, phosphorus or arsenic may be used.

Although the aluminum is used as the p-type (second conductivity type) impurity in the present embodiment, moreover, boron or gallium may be used.

While the ion implantation is taken as the method of increasing the impurity concentration of the first region in the first separation region 22 according to an example of the fabricating method, epitaxial growth may be used. In other words, after the drift layer 20 is grown, an epitaxial layer of a first conductivity type having a higher impurity concentration than the first impurity concentration of the drift layer 20 is grown and the steps excluding the implantation into the first separation region 22 in the fabricating method are subsequently carried out. Consequently, the impurity concentration of the first separation region 22 is made higher than the first impurity concentration of the drift layer 20, thereby enabling the formation of the first region.

Although the description has been given by using the specific examples, for example, the crystal structure, the plane direction of the main surface, the off angle, each implantation condition and the like, the scope of the first embodiment is not restricted thereto.

The present embodiment is particularly effective for the semiconductor element using the silicon carbide as explained in the detailed description of the invention. However, the present embodiment is also effective for other wide gap semiconductor elements and has a certain advantage also in a semiconductor element using silicon.

Although the description has been given to the case in which the n-channel MOSFET is used in the present embodiment, it is also possible to use a p-channel MOSFET in which a first conductivity type is set to be a p type and a second conductivity type is set to be an n type.

Furthermore, the present embodiment can also be used in an MOSFET having a super junction structure.

Moreover, although the silicon oxide is used as the gate insulating film 50 in the present embodiment, it is also possible to use a thermal oxide film formed by a thermal oxidation method or a deposited film formed by a CVD method. In addition, it is also possible to use an insulating film other than the silicon oxide.

Furthermore, although the description has been given to the so-called vertical type MOSFET in which the drain electrode 85 is formed on the back face of the substrate 10 in the present embodiment, the present embodiment can also be used in a so-called horizontal type MOSFET such as an RESURF type MOSFET in which the drain electrode 85 is formed on the surface of the drift layer 20.

Moreover, although the description has been given to the MOSFET having the gate insulating film 50 in the present embodiment, the present embodiment can be used in any unipolar device. For example, the present embodiment can also be used in a JFET (Junction Field Effect Transistor) or an MESFET (Metal Semiconductor Field Effect Transistor) which does not have the gate insulating film 50, for example.

Although the source ohmic electrode 70 and the Schottky electrode 75 are fabricated separately from each other in the present embodiment, they may be formed in connection by the same material or may be connected to each other by different materials.

Although the description has been given to the example in which the unit structure takes the shape of the square cell as shown in the top view of FIG. 2, it may take a hexagonal shape, and furthermore, a stripe shape in which the sectional structure of FIG. 1 is linked in a depth direction, and the like.

In addition, the semiconductor device described in the present embodiment can be used for electric power, electrical railroads, cars, home electric appliances, solar cells, communication or the like.

Second Embodiment

FIG. 5 is a chart showing an example of an impurity concentration profile of a first region in a first separation region 22 of a semiconductor device according to a second embodiment of the present invention. The second embodiment features that an n-type impurity concentration $N_{Nd}$ in a first region is set to be higher in a deeper region than a shallow region from a surface. The others are the same as in the first embodiment.

In the present embodiment, the impurity concentration of the first region is higher than a first impurity concentration of a drift layer 20, and as shown in FIG. 5 which is an example of an impurity concentration profile, the profile has the impurity concentration which is attenuated toward an interface with a Schottky electrode 75. In FIG. 5, an axis of abscissa indicates a distance $d_{SB}$ from a Schottky barrier junction into the drift layer 20 and an axis of ordinate indicates the impurity concentration $N_{Nd}$ in the first region.

In the present embodiment, it is sufficient that the first region is a region in which the n-type impurity concentration is higher than the first impurity concentration of the drift layer 20 in the first separation region 22, and the first region may be a high concentration layer having a constant impurity concentration and is formed in a deeper place from a surface, or may be a region which is equal to the first separation region 22 and which has such an impurity concentration profile that an impurity concentration is attenuated toward the surface as shown in FIG. 5. In the former case, a part provided in contact with the Schottky electrode 75 in the first separation region 22 is not the first region. Therefore, the impurity concentration in this part is lower than the impurity concentration of the first region. Moreover, in the latter case, the first separation region 22 is the same as the first region but the first region has the impurity concentration profile shown in FIG. 5. Therefore, the impurity concentration of the part provided in contact with the Schottky electrode 75 in the first separation region 22 is lower than that in a region in which the impurity concentration is the highest in the first region.

A fabricating method is almost the same as that in the first embodiment. It is sufficient to select an acceleration energy in such a manner that a range does not come to the vicinity of the surface in implantation of an N ion into the first separation region 22.

In addition to the advantage produced by the first embodiment, the present embodiment produces an advantage that, since the concentration of the first separation region 22 provided in contact with the Schottky electrode 75 is low, a leakage current is reduced, resulting in a semiconductor element having higher reliability. This is because if the impurity concentration of the interface is reduced in the Schottky barrier junction of a semiconductor, a difference in a work function between a metal and the semiconductor is increased; therefore, a band offset is increased so that a leakage current generated in application of the same electric field intensity is reduced.

FIGS. 6 to 9 show results obtained by verifying the advantage of the present embodiment through a device simulation. For simplicity, the first separation region 22 is set to be a region in which regions having high and low impurity concentrations take box profiles, respectively, and calculation is thus carried out. In other words, the first region having a constant concentration which is higher than the first impurity concentration of the drift layer 20 is formed in a deeper region from the interface with the Schottky electrode 75.

In FIG. 6, the impurity concentration of the first region is set to be a variable, and an axis of abscissa indicates a value x obtained through division of a thickness of the first region by a thickness of a whole well region 30 in the case in which the impurity concentration of the shallow region in the first separation region 22 where the first region is not formed is set to be equal to the first impurity concentration of the drift layer 20, that is, 3e15 cm$^{-3}$, and an axis of ordinate indicates a maximum unipolar current density $I_{max}$. The first region is provided in perfect contact with the well region 30 in the first separation region 22 as seen on a plane. Moreover, it is assumed that a deep side of the first region is positioned in an equal depth to a bottom of the well region 30. It is assumed that the first impurity concentration of the drift layer 20 is 3e15 cm$^{-3}$, the width of the first separation region 22 is 1.6 μm, an OFF state is supposed to be 3300 V, and the concentration of the first separation region 22 is adjusted within a higher range than 3e15 cm$^{-3}$ in such a manner that an electric field intensity to be applied to the Schottky barrier junction in the application of this voltage is 1.22 MV/cm. In FIG. 6, a characteristic shown in a broken line is obtained in the case in which the present embodiment is not used, and the calculation is carried out by setting the concentration of the first separation region 22 to be 3e15 cm$^{-3}$ which is equal to the first impurity concentration of the drift layer 20. Moreover, the width of the first separation region 22 is set to be 3 μm in such a manner that the electric field intensity to be applied to the Schottky barrier junction in the OFF state is obtained as 1.22 MV/cm equally to the above description.

From FIG. 6, it is apparent that a maximum unipolar current density $I_{max}$ is increased and an effect for improving trade-off of a maximum unipolar current and the electric field intensity to be applied to the Schottky barrier junction can be acquired if the concentration of the first separation region 22 having a greater thickness than the depth of the well region 30 by 42% is increased to form the first region.

Figure 7:
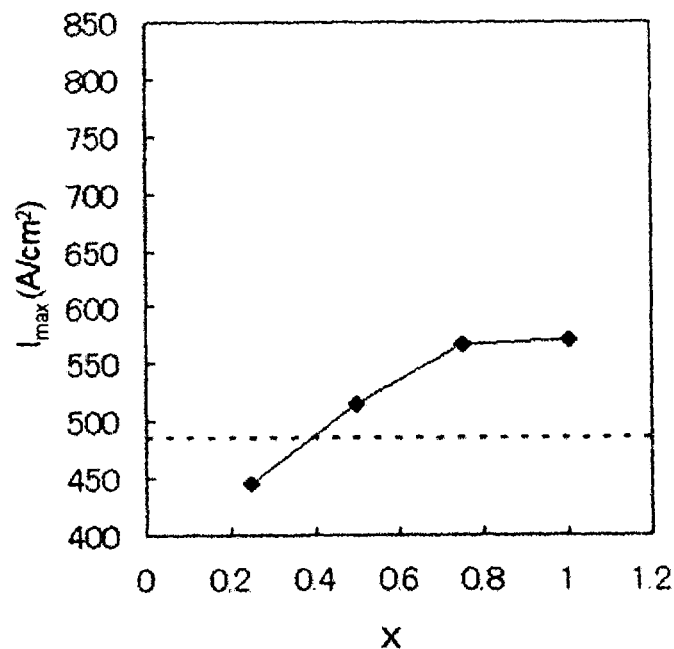
FIG. 7 is a chart showing a result obtained by simulating a relationship between a maximum unipolar current density and a value acquired through division of a thickness of the first region by a thickness of a well region, with a first impurity concentration of a drift layer set to be 2.5e15 cm$^{-3}$, according to the second embodiment of the present invention.

In FIG. 7, the calculation is performed on a condition that the impurity concentration of the first region is high and the impurity concentration in a shallow region where the first region is not formed in the first separation region 22 is equal to the first impurity concentration of the drift layer 20 in the same manner as in FIG. 6. FIG. 7 is different from FIG. 6 in that the first impurity concentration of the drift layer 20 is set to be 2.5e15 cm$^{-3}$ and the electric field intensity to be applied to the Schottky barrier junction in the application of 3300 V in the OFF state is set to be 1.13 MV/cm.

From FIG. 7, it is apparent that a maximum unipolar current density $I_{max}$ is increased and an effect for improving trade-off of a maximum unipolar current and the electric field intensity to be applied to the Schottky barrier junction can be acquired if the concentration of the first separation region 22 having a greater thickness than the depth of the well region 30 by 40% is increased to form the first region.

Figure 8:
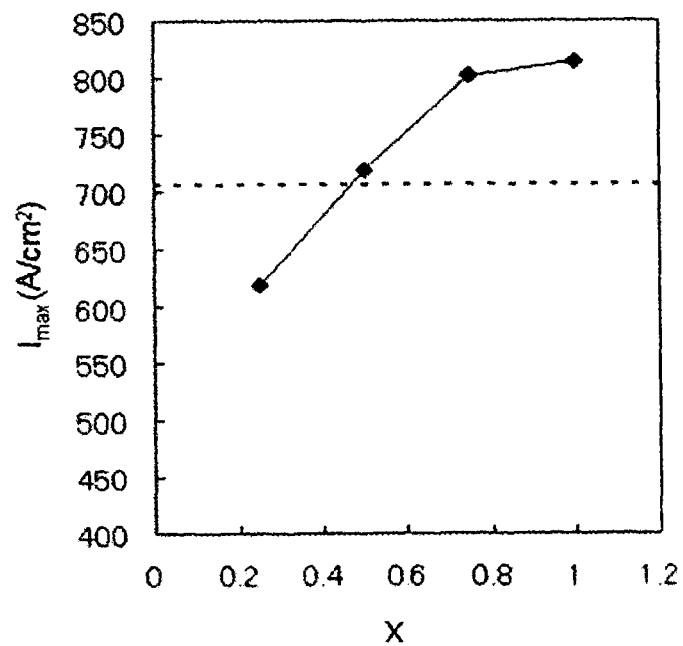
FIG. 8 is a chart showing a result obtained by simulating a relationship between a maximum unipolar current density and a value acquired through division of a thickness of the first region by a thickness of a well region, with a first impurity concentration of a drift layer set to be 3.5e15 cm$^{-3}$, according to the second embodiment of the present invention.

FIG. 8 is the same as FIG. 7 but is different from FIG. 7 in that the first impurity concentration of the drift layer 20 is 3.5e15 cm$^{-3}$. The electric field intensity to be applied to the Schottky barrier junction is 1.13 MV/cm.

From FIG. 8, it is apparent that a maximum unipolar current density $I_{max}$ is increased and an effect for improving trade-off of a maximum unipolar current and the electric field intensity to be applied to the Schottky barrier junction can be acquired if the concentration of the first separation region 22 having a greater thickness than the depth of the well region 30 by 47% is increased to form the first region.

Figure 9:
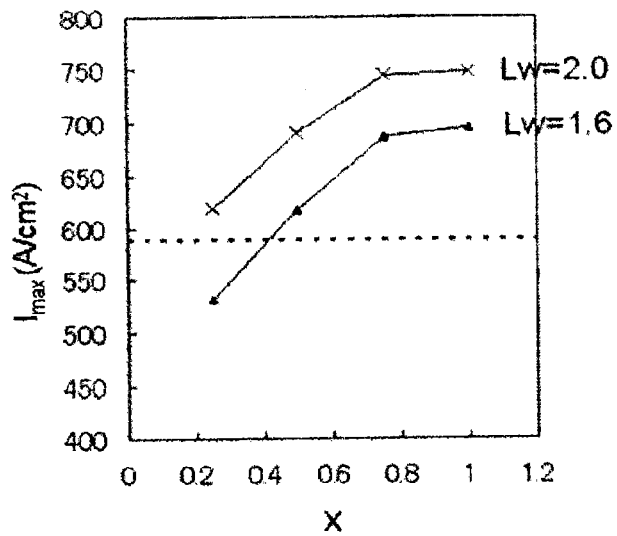
FIG. 9 is a chart showing a result obtained by changing a width of a first separation region to simulate the relationship between the maximum unipolar current density and the value acquired through the division of the thickness of the first region by the thickness of the well region according to the second embodiment of the present invention.

FIG. 9 shows the case in which the first impurity concentration of the drift layer 20 is set to be 3.0e15 cm$^{-3}$ and a width $L_w$ of the first separation region 22 is varied. The electric field intensity to be applied to the Schottky barrier junction is 1.24 MV/cm.

From FIG. 9, it is apparent that the maximum unipolar current density $I_{max}$ is increased if the concentration of the region having a greater thickness than the depth of the well region 30 by 42% is increased to form the first region when $L_w$ is 1.6 μm, the maximum unipolar current density $I_{max}$ is increased even if the first region has a smaller thickness than the depth of the well region 30 by 20% when $L_w$ is 2.0 μm, and the effect for improving the trade-off of the maximum unipolar current and the electric field intensity to be applied to the Schottky barrier junction can be acquired.

In the case in which the first region is formed on the deep side in the first separation region 22, and the impurity concentration is set to be higher than the first impurity concentration of the drift layer 20 and is set to be lower than the second impurity concentration of the well region 30, thus, it is possible to obtain the same advantage as that of the first embodiment, and furthermore, to reduce the leakage current in the Schottky barrier junction more greatly, by increasing the thickness of the first region to be greater than a thickness at a certain rate with respect to the depth of the well region 30.

The thickness at the certain rate with respect to the depth of the well region 30 from which the advantage can be obtained depends on the first impurity concentration of the drift layer 20 and the width $L_w$ of the first separation region 22 as described with reference to FIGS. 6 to 9, and furthermore, depends on as to whether the impurity profile of FIG. 5 is a box profile or an attenuation profile, and depends on a voltage to be applied in the OFF state, and the like.

In the second embodiment according to the present invention, the different portions from the first embodiment according to the present invention have been described and the same or corresponding portions have been omitted.

Third Embodiment

Figure 10:
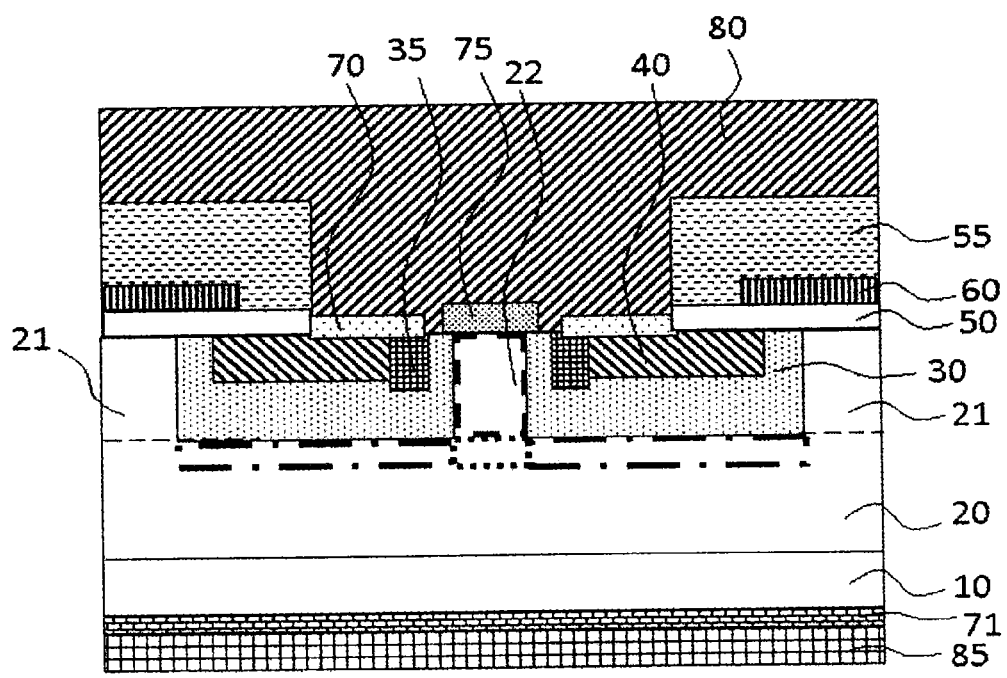
FIG. 10 is a sectional view showing a semiconductor device according to a third embodiment of the present invention.

FIG. 10 is a sectional view showing a semiconductor device according to a third embodiment of the present invention. In FIG. 10, a region which is surrounded by a thick broken line and is equivalent to the first separation region 22 is a first region. In the third embodiment, furthermore, a region provided directly under a first separation region 22 and surrounded by a thick dotted line is referred to as a second region, and a region provided directly under a well region 30 and surrounded by a thick dashed-dotted line is referred to as a third region. The third embodiment features that n-type (first conductivity type) impurity concentrations of the second region provided in the lower part of the first region and the third region provided directly under the well region 30 as well as an impurity concentration of the first region of the first separation region 22 are increased with respect to a first impurity concentration of a drift layer 20. The others are the same as those in the first or second embodiment.

A fabricating method is almost the same as that in the first embodiment and it is sufficient to simply perform implantation having a higher energy than the energy required in the first embodiment into a region obtained by adding the first separation region 22 and the well region 30 in a step of implanting an N ion into the first separation region 22.

The second region is a high concentration region formed in the drift layer 20 provided in the lower part of the first region, and the third region is a high concentration region formed in the drift layer 20 provided directly under the well region 30, which are formed as described above.

In other words, the second region has an upper surface positioned in the same depth as the bottom part of the well region 30 in the lower part of the first region, and the third region has an upper surface formed in contact with the bottom part of the well region 30 directly under the well region 30.

The advantage produced by the third embodiment is more remarkable than the advantage of the first embodiment. In other words, it is possible to further improve the trade-off of a maximum unipolar current density and an electric field intensity to be applied to a Schottky barrier junction and the trade-off of the maximum unipolar current density and an ON resistance. For this reason, thermal runaway is caused with difficulty so that a semiconductor device having high reliability can be obtained. Moreover, a chip area can be decreased, so that a cost can be reduced.

Figure 11:
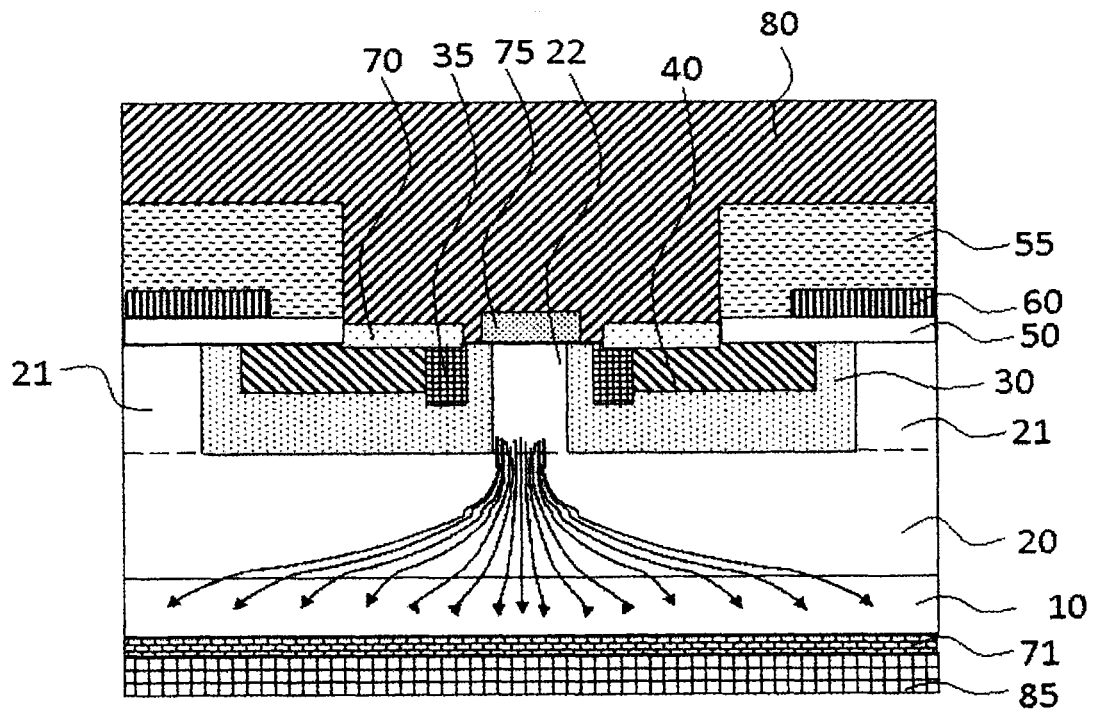
FIG. 11 is a sectional view showing the semiconductor device for explaining a reflux state of the semiconductor device according to the third embodiment of the present invention.

The reason will be described below. First of all, a reflux state will be considered. FIG. 11 is a view for explaining the reflux state according to the present embodiment, and an arrow in the drawing typically shows a path for a reflux current in the reflux state.

When the reflux current flowing from a Schottky electrode 75 and passing through the first separation region 22 enters the drift layer 20, it is diffused in an oblique direction because a conduction path is expanded. For this reason, in a region which is the most distant from the first separation region 22 in the well region 30, a density of the reflux current flowing in the drift layer 20 in the lower part is relatively lower as compared with the vicinity of the first separation region 22. Therefore, an electric potential on an n side (the drift layer 20 side) in a pn junction is relatively low. More specifically, this implies that a voltage applied to the pn junction is high and a pn diode can easily be operated. In order to suppress this and to increase the maximum unipolar current, it is effective to cause the reflux current in a large amount to flow to the drift layer 20 provided in the lower part of a position placed apart from the first separation region 22 in the well region 30. For this purpose, it is effective that the reflux current entering the drift layer 20 from the first separation region 22 is diffused more widely.

In the case in which the second region is present directly under the first separation region 22 and the third region is present directly under the well region 30 as shown in FIG. 10 using the present embodiment, a current flows in a large amount into a high concentration region having a low conductivity. For this reason, the current is diffused more widely in an oblique direction. Accordingly, a pn diode is operated with difficulty, so that the maximum unipolar current density is increased.

Figure 12:
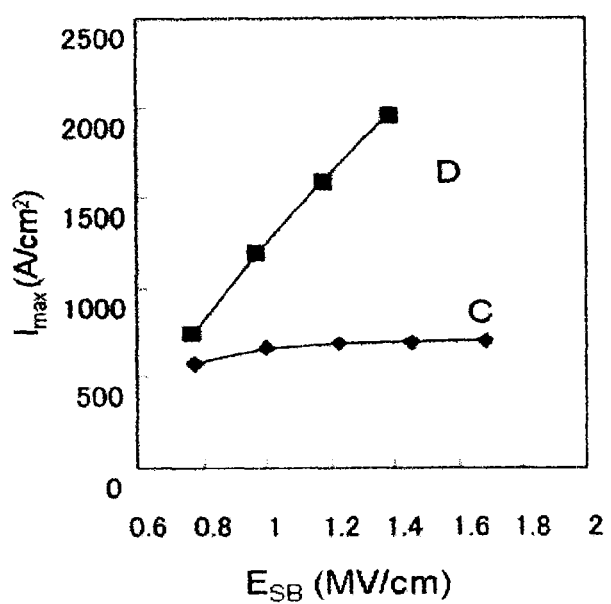
FIG. 12 is a chart showing a result obtained by simulating a relationship between a maximum unipolar current density and an electric field intensity to be applied to a Schottky barrier junction in the semiconductor device according to the third embodiment of the present invention.

FIG. 12 shows a result obtained by confirming the advantage of the present embodiment by a device simulation. There is shown a relationship between a maximum unipolar current density $I_{max}$ and an electric field intensity $E_{SB}$ to be applied to the Schottky barrier junction when the impurity concentration is varied in the case (structure C) in which the depth of the well region 30 is set to be 0.8 μm and only the first separation region 22 to be the first region is caused to have a high concentration and the case (structure D) in which the first region is the whole first separation region 22, the second region has a thickness of 0.2 μm, the third region has a thickness of 0.2 μm, and the first to third regions are caused to have high concentrations. In FIG. 12, for simplicity, the impurity concentrations of the first to third regions are set to be equal to each other. A section of the structure C corresponds to the case in which the first embodiment is used in FIG. 1, and a section of the structure D corresponds to the case in which the present embodiment is used in FIG. 10. From FIG. 12, it is apparent that the structure D using the present embodiment has an effect for increasing the maximum unipolar current density more greatly than the structure C using the first embodiment, in the case in which the electric field intensity to be applied to the Schottky barrier junction is equal.

In other words, the present embodiment shown in the example represents the case in which the second region and the third region are caused to have higher concentrations than the first impurity concentration of the drift layer 20 in addition to the first embodiment. However, the advantage of the first embodiment can be obtained more remarkably.

Moreover, although the second region and the third region are provided in the present embodiment in addition to the first embodiment, it is also possible to provide the second region and the third region in addition to the second embodiment.

Discussion was made on the assumption that the whole region corresponding to the part provided directly under the well region 30 is set to be the third region in the present embodiment. However, it is possible to easily guess that a part of the advantage of the third embodiment can be obtained by simply causing only a part provided directly under the well region 30 at a side contact with the first separation region 22 to have a high concentration as the third region, as shown in a thick dashed-dotted line in a sectional view of FIG. 13.

Although the description has been given to the case in which both the second region and the third region are caused to have high concentrations in the present embodiment, moreover, it is apparent that a part of the advantage of the third embodiment can be obtained by either of them.

Furthermore, the n-type (first conductivity type) impurity concentrations in the second region and the third region according to the present embodiment are desirably lower than a p-type (second conductivity type) second impurity concentration in the well region 30 in such a manner that the well region 30 does not cause a punch through destruction in an OFF state.

In the third embodiment according to the present invention, the different portions from the first or second embodiment according to the present invention have been described and the same or corresponding portions have been omitted.

Fourth Embodiment

FIG. 14 is a sectional view showing a semiconductor device according to a fourth embodiment of the present invention. The present embodiment features that a region extending from a surface of a first separation region 22 to a certain depth which is smaller than a well region 30 is set to be a first region, in which an impurity concentration is increased more greatly than a first impurity concentration of a drift layer 20. The others are almost the same as those in the first, second or third embodiment.

A fabricating method is almost the same as that in the first embodiment and it is sufficient to simply form the first region which is shallower than the well region 30 in a step of implanting an N ion into the first separation region 22.

In order to effectively improve trade-off of a maximum unipolar current density and an electric field intensity to be applied to a Schottky barrier junction, it is preferable to increase an impurity concentration of the whole first separation region 22, that is, a region to reach the same depth as the well region 30 from an interface provided in contact with a Schottky electrode 75 with respect to the drift layer 20. If an impurity concentration of only a region having a thickness at a certain rate from a surface side in the first separation region 22 is increased with respect to the first impurity concentration of the drift layer 20 instead of the whole region as in the fourth embodiment, however, it is possible to acquire the advantage of the present technique.

Figure 15:
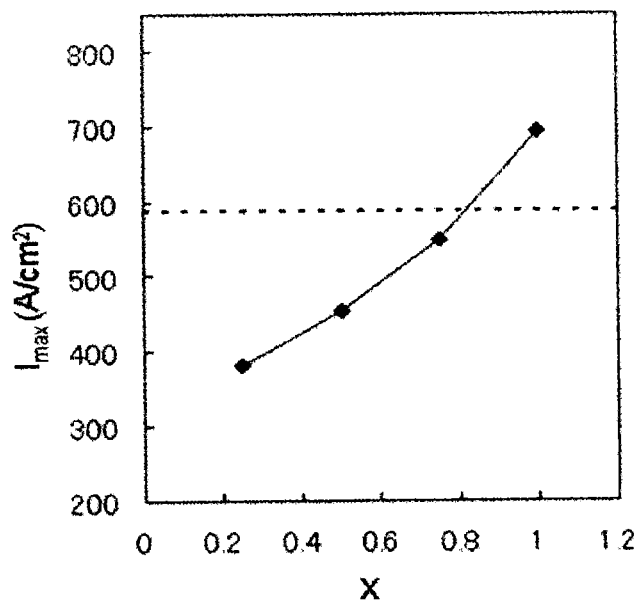
FIG. 15 is a chart showing a result obtained by simulating a relationship between a maximum unipolar current density and a value acquired through division of a thickness of a first region by a thickness of a well region according to the fourth embodiment of the present invention.

FIG. 15 shows a relationship between a rate x obtained through division of the depth of the first region to be a high concentration region in the first separation region 22 by the depth of the well region 30 and a maximum unipolar current density $I_{max}$, the relationship being obtained by a device simulation. An axis of abscissa indicates a value x obtained through division of a thickness of the first region by a thickness of the whole well region 30 and an axis of ordinate indicates a maximum unipolar current density $I_{max}$ in the case in which the impurity concentration on the surface side of the first separation region 22 is increased to form the first region and the impurity concentration is set to be a variable. The first impurity concentration of the drift layer 20 is 3e15 cm$^{-3}$ and the width of the first separation region 22 is 1.6 μm, and an OFF state is supposed to be 3300 V and the concentration of the first region is adjusted within a higher range than 3e15 cm$^{-3}$ in such a manner that an electric field intensity to be applied to the Schottky barrier junction in the application of this voltage is 1.22 MV/cm. In FIG. 15, a characteristic shown in a broken line is obtained in the case in which the present embodiment is not used, and the calculation is carried out by setting the concentration of the whole first separation region 22 to be 3e15 cm$^{-3}$ which is equal to the concentration of the drift layer 20. Moreover, the width of the first separation region 22 is set to be 3 μm in such a manner that the electric field intensity to be applied to the Schottky barrier junction in the OFF state is set to be 1.22 MV/cm equally to the above description.

From FIG. 15, it is apparent that the effect for improving the trade-off of the maximum unipolar current density $I_{max}$ and the electric field intensity to be applied to the Schottky barrier junction can be acquired by increasing the maximum unipolar current density even if the depth of the first region is smaller than that of the well region 30.

From FIG. 15, it is apparent that the depth of the first region to have a high concentration is preferably set to be equal to or higher than 82% of the depth of the well region 30 in order to obtain the advantage of the present embodiment. In the same manner as the description of the third embodiment, however, the depth to have a high concentration is varied depending on the first impurity concentration of the drift layer 20, the width $L_w$ of the first separation region 22 or the voltage applied in the OFF state.

In the fourth embodiment according to the present invention, the different portions from the first or third embodiment according to the present invention have been described and the same or corresponding portions have been omitted.

Fifth Embodiment

Figure 16:
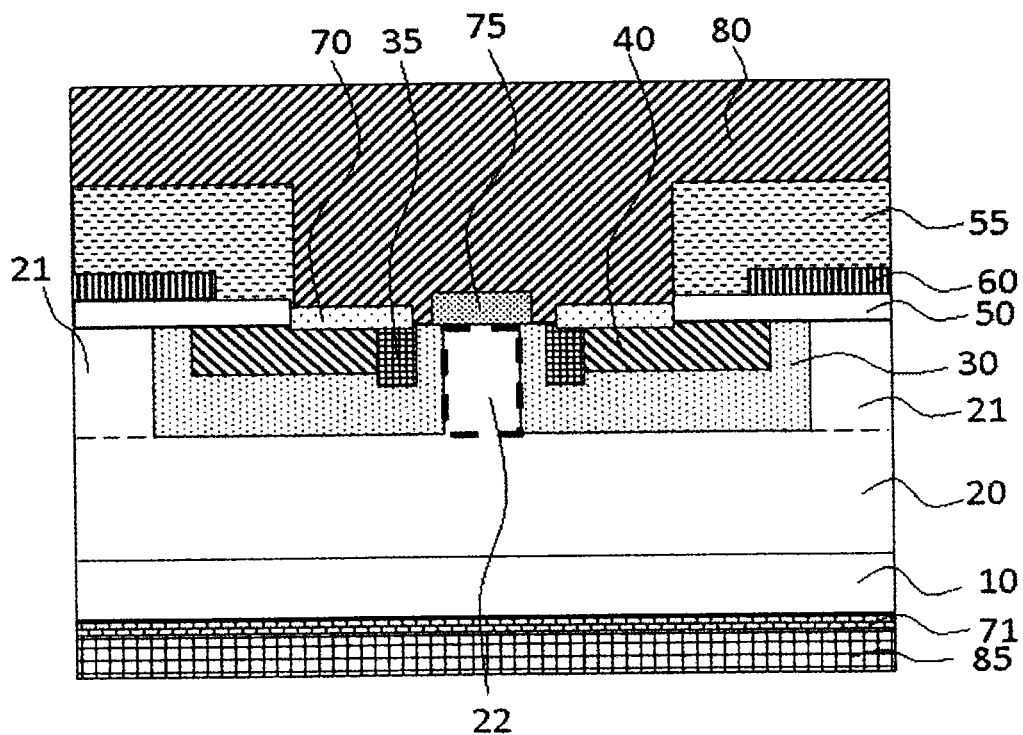
FIG. 16 is a sectional view showing a semiconductor device according to a fifth embodiment of the present invention.

FIG. 16 is a sectional view showing a semiconductor device according to a fifth embodiment of the present invention. The fifth embodiment features that an impurity concentration of a first separation region 22 is set to be higher than a first impurity concentration of a drift layer 20 to form a first region, and an impurity concentration of a second separation region 21 is set to be higher than the first impurity concentration of the drift layer 20. The others are the same as in the first to fourth embodiments.

A fabricating method is almost the same as that in each of the fabricating methods according to the first to fourth embodiments. Notably, when N implantation is to be carried out into the first separation region 22, an implantation mask is formed by a photoresist or the like which opens a region including the second separation region 21 and the first separation region 22, thus, the N implantation can be performed. Consequently, it is possible to implement the N implantation into the second separation region 21 and the N implantation into the first separation region 22 through a single step. As a result, the number of the steps can be decreased so that a chip cost can be reduced.

In other words, in the present embodiment, the n-type (first conductivity type) impurity concentrations of the second separation region 21 and the first separation region 22 are equal to each other, are higher than the first impurity concentration of the drift layer 20 and are lower than the second impurity concentration of the well region 30.

Moreover, by using the present embodiment, it is possible to reduce a resistance of the second separation region 21 in an ON state of an MOSFET by increasing the concentration of the second separation region 21, therefore, it is possible to reduce an ON resistance. Furthermore, by increasing the concentration of the second separation region 21, it is possible to decrease the width of the second separation region 21. Therefore, it is possible to implement further reduction in the ON resistance by decrease in a cell pitch and cut-down of a cost by decrease in a chip area.

According to the present embodiment, the concentrations of the second separation region 21 and the first separation region 22 may be increased in separate steps, or the concentrations of the second separation region 21 and the first separation region 22 may be different from each other. Also in that case, it is possible to obtain advantages, for example, the reduction in the ON resistance and the decrease in the cell pitch and the chip area.

In the embodiment according to the present invention, the different portions from the first to fourth embodiments according to the present invention have been described and the same or corresponding portions have been omitted.

Sixth Embodiment

Figure 17:
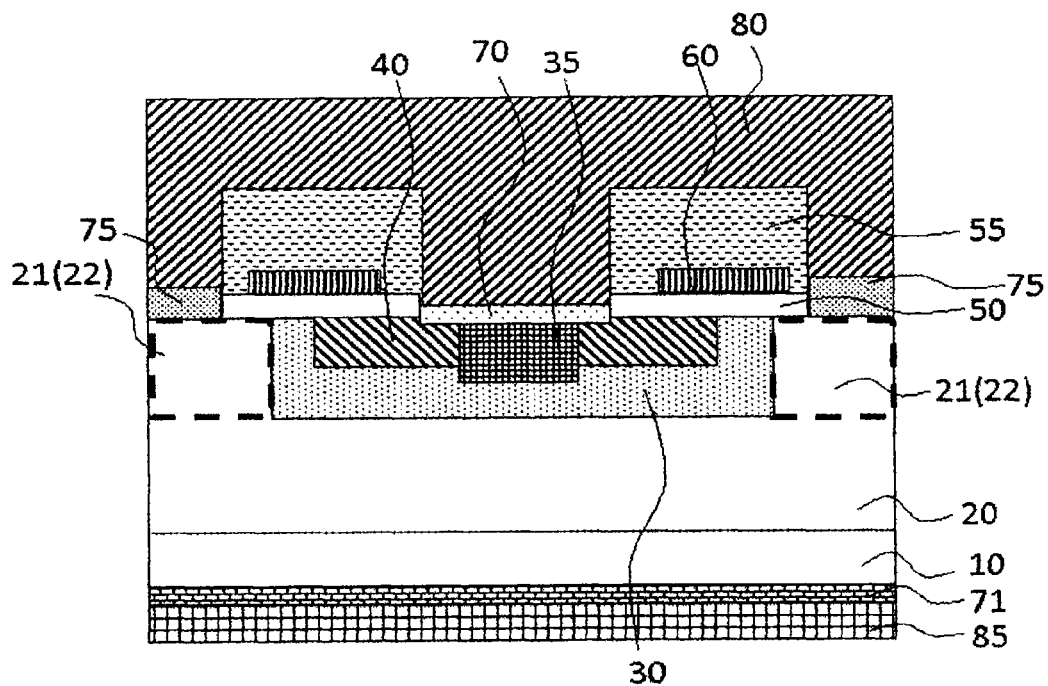
FIG. 17 is a sectional view showing a semiconductor device according to a sixth embodiment of the present invention.

FIG. 17 is a sectional view showing a semiconductor device according to a sixth embodiment of the present invention. The sixth embodiment features that a second separation region 21 is caused to include a first separation region 22 containing the first region present in the first embodiment and a Schottky electrode 75 is formed on the second separation region 21 as shown in the sectional view of FIG. 17. In the present embodiment, the first separation region 22 is included in the second separation region 21. In other words, in the first to fifth embodiments, the first separation region 22 separates the two well regions 30 in a single unit cell as seen on a section. However, in the present embodiment, the first separation region 22 included in the second separation region 21 separates the two sell regions 30 across the adjacent unit cells as seen on a section. The others are the same as those in the first to fifth embodiments.

In the present embodiment, an ON current and a reflux current pass through the second separation region 21 in an ON state and a reflux state, respectively. As compared with the first embodiment, the first separation region 22 described in the first embodiment is not required. Therefore, reduction in a cell pitch can be implemented.

In the sixth embodiment, a concentration of the first region in a certain depth of the second separation region 21 provided directly under the Schottky electrode 75 is set to be higher than a first impurity concentration of a drift layer 20 and to be lower than a second impurity concentration of the well region 30.

FIG. 17 is a sectional view showing the case in which the second separation region 21 and the first region indicated by a region surrounded by a thick broken line are the same.

By using the present embodiment, it is possible to obtain the same advantages as those in the first to fourth embodiments. In other words, it is possible to improve the trade-off of a maximum unipolar current density and an electric field intensity to be applied to a Schottky barrier junction and the trade-off of the maximum unipolar current density and an ON resistance. In other words, it is possible to obtain a semiconductor device having high reliability because thermal runaway is caused with difficulty though a unipolar current is increased, and to reduce the ON resistance because a cell pitch can be decreased. Moreover, it is also possible to reduce a cost by decreasing a chip area.

In the embodiment according to the present invention, the different portions from the first to fourth embodiments according to the present invention have been described and the same or corresponding portions have been omitted.

Seventh Embodiment

Figure 18:
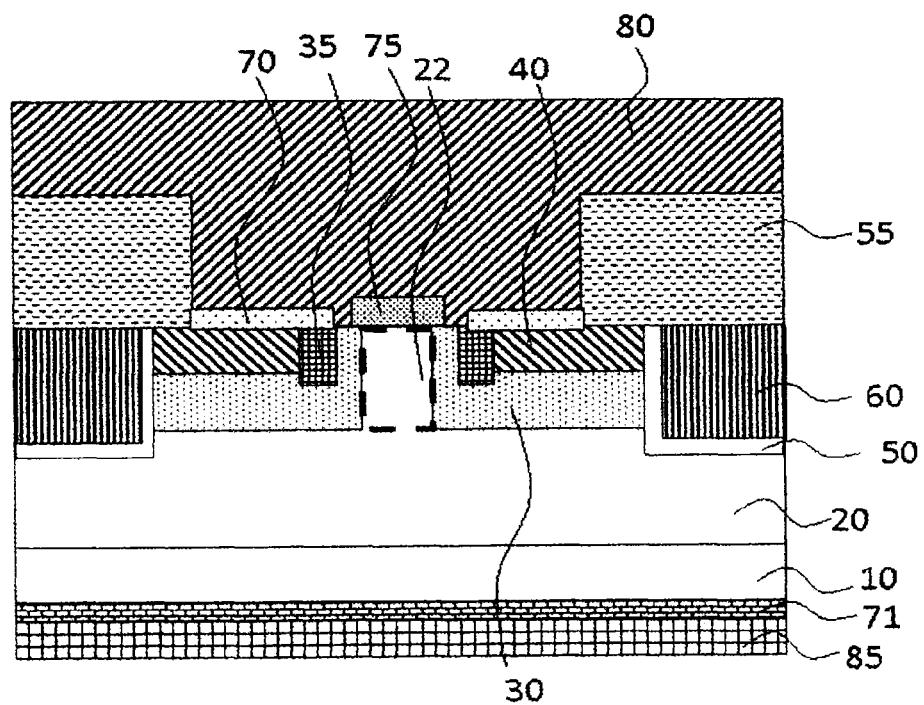
FIG. 18 is a sectional view showing a semiconductor device according to a seventh embodiment of the present invention.

FIG. 18 is a sectional view showing a semiconductor device according to a seventh embodiment of the present invention. The seventh embodiment features that the semiconductor device is a trench type MOSFET and the others are the same as those in the first to fourth embodiments.

By using the seventh embodiment, it is possible to obtain the same advantages as those in the first to fourth embodiments, and furthermore, the effect for reducing an ON resistance by utilizing the trench type MOSFET. In the trench type MOSFET, a gate insulating film 50 is formed in a trench side wall. In other words, the surface of the well region 30 and the surface of the end portion of the source region 40, on which the gate insulating film 50 is formed in the first embodiment, correspond to surfaces of the well region 30 and the source region 40 that are in contact with the trench side wall 50 in the present embodiment. Moreover, the gate electrode 60 is opposed to the well region 30 and the end portion of the source region 40 with the gate insulating film 50 interposed, and the well region 30 and the end portion of the source region 40 represent the well region 30 and the source region 40 on the trench side wall surface.

In the trench type MOSFET, a channel region is formed along the trench side wall. Therefore, a cell pitch can be decreased so that the ON resistance can be reduced.

Moreover, in a silicon carbide MOSFET, moreover, it is possible to obtain an advantage that a channel characteristic can be enhanced and the ON resistance can be reduced by a difference of plane direction where a channel is formed.

In the seventh embodiment according to the present invention, different portions from the first to fourth embodiments according to the present invention have been described and the same or corresponding portions have been omitted.

Description Of Reference Symbols 10 substrate, 20 drift layer, 21 second separation region, 22 first separation region, 30 well region, 35 well contact region, 40 source region, 50 gate insulating film, 55 interlayer insulating film, 60 gate electrode, 70 ohmic electrode, 71 back ohmic electrode, 75 Schottky electrode, 80 source electrode, 85 drain electrode.

The invention claimed is:

1. A semiconductor device comprising:
  a drift layer having a first impurity concentration of a first conductivity type;
  a plurality of well regions provided on a surface layer side of said drift layer apart from each other and having a second impurity concentration of a second conductivity type;
  a Schottky electrode provided on a surface of said drift layer and connected electrically to a source ohmic electrode; and
  a first region provided in a lower part of said Schottky electrode between said well regions which are adjacent to each other and having an impurity concentration of a first conductivity type which is higher than said first impurity concentration and is lower than said second impurity concentration.

2. The semiconductor device according to claim 1, wherein an impurity concentration of a first conductivity type in said first region has a concentration profile that is attenuated toward a junction interface of said Schottky electrode and said drift layer.

3. The semiconductor device according to claim 1, wherein said first region is formed from a deeper region than a surface to an equal depth to a bottom part of said well region.

4. The semiconductor device according to claim 1, wherein said first region is formed from a surface or a deeper region than a surface to an equal depth to a bottom part of said well region.

5. The semiconductor device according to claim 1 comprising a second region of a first conductivity type formed in a lower part of said first region,
  wherein an impurity concentration of a first conductivity type in said second region is higher than said first impurity concentration.

6. The semiconductor device according to claim 1 comprising a third region of a first conductivity type provided directly under at least a part of said well region,
  wherein an impurity concentration of a first conductivity type in said third region is higher than said first impurity concentration.

7. The semiconductor device according to claim 1 comprising:
  a first separation region of a first conductivity type between said well regions which are adjacent to each other, which includes said first region, and has said Schottky electrode formed on at least a part of a surface; and
  a second separation region of a first conductivity type between said well regions which are adjacent to each other, and is present in a path through which an ON-state current flows when said semiconductor device is in an ON state.

8. The semiconductor device according to claim 7, wherein an impurity concentration of a first conductivity type in said second separation region is higher than said first impurity concentration.

9. The semiconductor device according to claim 7, wherein an impurity concentration of a first conductivity type in said first region is equal to an impurity concentration of a first conductivity type in said second separation region.

10. The semiconductor device according to claim 7, wherein said second separation region includes said first separation region.

11. The semiconductor device according to claim 1, wherein said semiconductor device is a trench type MOSFET.

12. The semiconductor device according to claim 1, wherein said source ohmic electrode and said Schottky electrode are formed in connection.

13. The semiconductor device according to claim 1 comprising:

a source region of a first conductivity type formed in said well region; and a well contact region of a second conductivity type formed in said well region and adjacent to said source region, wherein said source ohmic electrode is formed in at least a part of a surface of said source region and a surface of said well contract region.

14. The semiconductor device according to claim 13 comprising:

a gate insulating film formed on a surface of said well region and a part of said source region;

a gate electrode formed opposite to said well region and an end portion of said source region with said gate insulating film interposed therebetween;

a semiconductor substrate having said drift layer formed on a surface; and a drain electrode on a back face of said semiconductor substrate.

15. The semiconductor device according to claim 1, wherein said semiconductor device is an n-channel silicon carbide MOSFET.

16. A semiconductor device comprising:

a drift layer having a first impurity concentration of a first conductivity type;

a plurality of well regions provided on a surface layer side of said drift layer apart from each other and having a second impurity concentration of a second conductivity type;

a Schottky electrode provided on a surface of said drift layer and connected electrically to a source ohmic electrode; and a first region in a lower part of said Schottky electrode between said well regions which are adjacent to each other, wherein an impurity concentration of a first conductivity type in a certain depth of said first region is lower than said second impurity concentration in the same depth of said well region and is higher than said first impurity concentration.

17. The semiconductor device according to claim 16, wherein an impurity concentration of a first conductivity type in said first region has a concentration profile that is attenuated toward a junction interface of said Schottky electrode and said drift layer.

18. The semiconductor device according to claim 16, wherein said first region is formed from a deeper region than a surface to an equal depth to a bottom part of said well region.

19. The semiconductor device according to claim 16, wherein said first region is formed from a surface or a deeper region than a surface to an equal depth to a bottom part of said well region.

20. The semiconductor device according to claim 16 comprising a second region of a first conductivity type formed in a lower part of said first region, wherein an impurity concentration of a first conductivity type in said second region is higher than said first impurity concentration.

21. The semiconductor device according to claim 16 comprising a third region of a first conductivity type provided directly under at least a part of said well region, wherein an impurity concentration of a first conductivity type in said third region is higher than said first impurity concentration.

22. The semiconductor device according to claim 16 comprising:

a first separation region of a first conductivity type between said well regions which are adjacent to each other, which includes said first region, and has said Schottky electrode formed on at least a part of a surface; and a second separation region of a first conductivity type between said well regions which are adjacent to each other, and is present in a path through which an ON-state current flows when said semiconductor device is in an ON state.

23. The semiconductor device according to claim 22, wherein an impurity concentration of a first conductivity type in said second separation region is higher than said first impurity concentration.

24. The semiconductor device according to claim 22, wherein an impurity concentration of a first conductivity type in said first region is equal to an impurity concentration of a first conductivity type in said second separation region.

25. The semiconductor device according to claim 22, wherein said second separation region includes said first separation region.

26. The semiconductor device according to claim 16, wherein said semiconductor device is a trench type MOSFET.

27. The semiconductor device according to claim 16, wherein said source ohmic electrode and said Schottky electrode are formed in connection.

28. The semiconductor device according to claim 16 comprising:

a source region of a first conductivity type formed in said well region; and a well contact region of a second conductivity type formed in said well region and adjacent to said source region, wherein said source ohmic electrode is formed in at least a part of a surface of said source region and a surface of said well contract region.

29. The semiconductor device according to claim 28 comprising:

a gate insulating film formed on a surface of said well region and a part of said source region;

a gate electrode formed opposite to said well region and an end portion of said source region with said gate insulating film interposed therebetween;

a semiconductor substrate having said drift layer formed on a surface; and a drain electrode on a back face of said semiconductor substrate.

30. The semiconductor device according to claim 16, wherein said semiconductor device is an n-channel silicon carbide MOSFET.

* * * * *